(12) United States Patent
Shirasaki et al.

(10) Patent No.: US 7,944,414 B2
(45) Date of Patent: May 17, 2011

(54) DISPLAY DRIVE APPARATUS IN WHICH DISPLAY PIXELS IN A PLURALITY OF SPECIFIC ROWS ARE SET IN A SELECTED STATE WITH PERIODS AT LEAST OVERLAPPING EACH OTHER, AND GRADATION CURRENT IS SUPPLIED TO THE DISPLAY PIXELS DURING THE SELECTED STATE, AND DISPLAY APPARATUS

(75) Inventors: Tomoyuki Shirasaki, Higashiyamato (JP); Tsuyoshi Ozaki, Fussa (JP); Jun Ogura, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 1211 days.

(21) Appl. No.: 11/138,978

(22) Filed: May 25, 2005

(65) Prior Publication Data

US 2005/0264500 A1    Dec. 1, 2005

(30) Foreign Application Priority Data

May 28, 2004  (JP) ................................ 2004-160140
Sep. 14, 2004  (JP) ................................ 2004-266441

(51) Int. Cl.
*G09G 3/30* (2006.01)
(52) U.S. Cl. .......................................... 345/77; 345/82
(58) Field of Classification Search .................... 345/76, 345/204; 315/169.3
See application file for complete search history.

(56) References Cited

U.S. PATENT DOCUMENTS

| 6,127,998 | A | 10/2000 | Ichikawa et al. |
| 6,320,325 | B1 | 11/2001 | Cok et al. |
| 7,068,265 | B2 | 6/2006 | Kim |
| 7,307,607 | B2 | 12/2007 | Osame et al. |
| 2002/0067300 | A1* | 6/2002 | Tanaka .......................... 341/154 |

(Continued)

FOREIGN PATENT DOCUMENTS

EP    0 837 445 A1    4/1998

(Continued)

OTHER PUBLICATIONS

Taiwanese Office Action dated Nov. 17, 2008 and English translation thereof issued in a counterpart Taiwanese Application.

(Continued)

*Primary Examiner* — Chanh Nguyen
*Assistant Examiner* — Long Pham
(74) *Attorney, Agent, or Firm* — Holtz, Holtz, Goodman & Chick, PC

(57) ABSTRACT

A display drive apparatus includes a selection circuit which sets display pixels in a plurality of specific rows of the display panel in a selected state with periods at least overlapping each other. A gradation signal generation circuit generates a gradation signal which controls a luminance gradation of each display pixel based on the display data and sequentially supplies the generated gradation signal in time series. A plurality of signal distribution circuits sequentially distribute the gradation signal supplied by the gradation signal generation circuit in accordance with the plurality of display pixels in each column at the timing of time-series supply. A plurality of current holding circuits individually hold the distributed gradation signal and simultaneously supply as the gradation current a current having a current value based on the held gradation signal to the display pixels in the plurality of specific rows.

37 Claims, 19 Drawing Sheets

U.S. PATENT DOCUMENTS

| | | |
|---|---|---|
| 2002/0158855 A1 | 10/2002 | Matsueda |
| 2003/0001870 A1 | 1/2003 | Kageyama et al. |
| 2003/0132931 A1 | 7/2003 | Kimura et al. |
| 2004/0233141 A1* | 11/2004 | Matsumoto ............... 345/76 |
| 2004/0233142 A1* | 11/2004 | Matsumoto et al. ........ 345/76 |
| 2004/0239596 A1* | 12/2004 | Ono et al. ................. 345/76 |
| 2004/0263540 A1* | 12/2004 | Ooishi et al. .............. 345/690 |
| 2005/0140596 A1* | 6/2005 | Lee et al. .................. 345/76 |

FOREIGN PATENT DOCUMENTS

| | | |
|---|---|---|
| EP | 0 911 796 A1 | 4/1999 |
| EP | 1 207 511 A1 | 5/2002 |
| EP | 1 260 958 A2 | 11/2002 |
| EP | 1 465 146 A2 | 10/2004 |
| JP | 2002-182613 A | 6/2002 |
| JP | 2003-043952 A | 2/2003 |
| JP | 2003-058108 A | 2/2003 |
| JP | 2004-038177 A | 2/2004 |
| JP | 2004-046124 A | 2/2004 |
| JP | 2004-1022992 | 4/2004 |
| JP | 2004-318093 A | 11/2004 |
| JP | 2008-104770 A | 5/2008 |
| JP | 2008-104771 A | 5/2008 |
| KR | 2003-0091820 A | 12/2003 |
| TW | 535021 | 6/2003 |
| TW | 584755 | 4/2004 |
| WO | WO 2004/086347 A2 | 10/2004 |

OTHER PUBLICATIONS

A Japanese Office Action (and English translation thereof) dated Feb. 12, 2008, issued in a counterpart Japanese Application.

A Japanese Office Action (and English translation thereof) dated Feb. 13, 2008, issued in a counterpart Japanese Application.

Japanese Office Action (and English translation thereof) dated Sep. 16, 2008, issued in counterpart Japanese Application No. 2008-104770.

Japanese Office Action (and English translation thereof) dated Sep. 16, 2008, issued in counterpart Japanese Application No. 2008-104771.

Japanese Office Action dated May 22, 2009 (8 pages), and English translation thereof (12 pages), issued in counterpart Japanese Application No. 2004-266441.

* cited by examiner

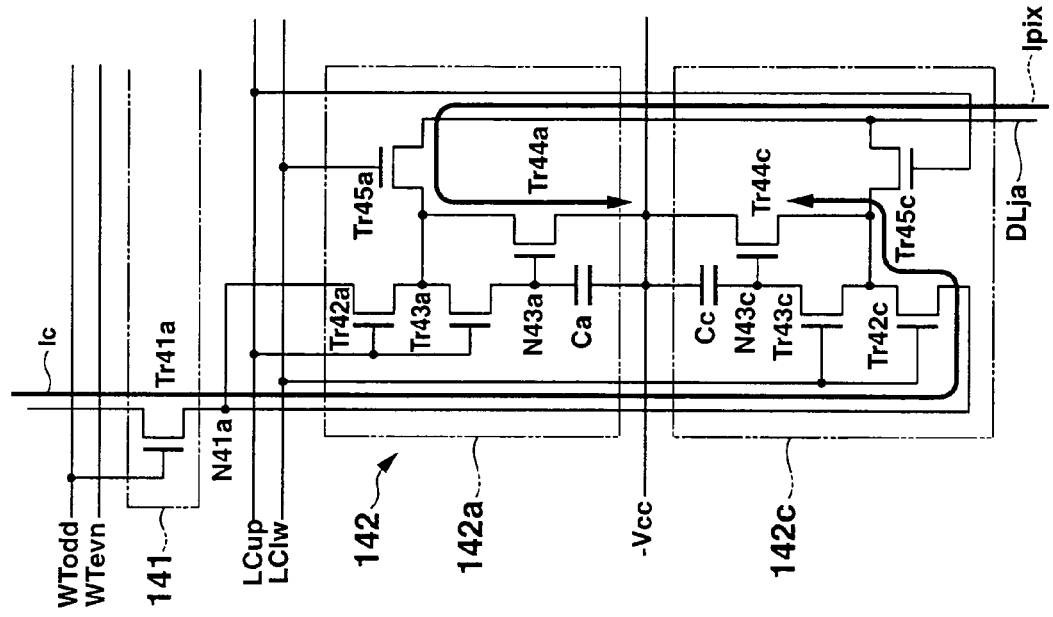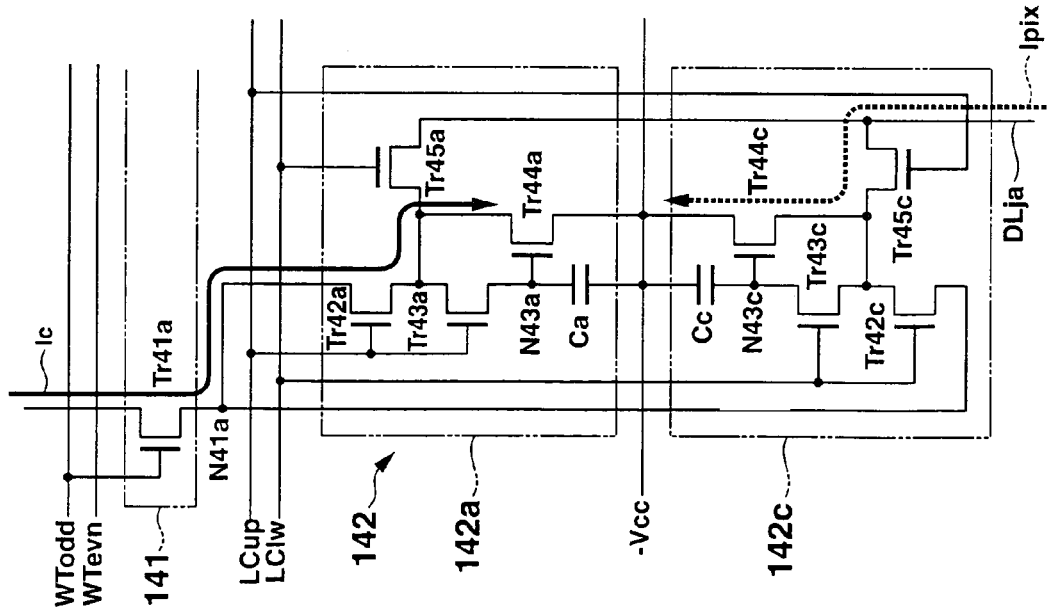

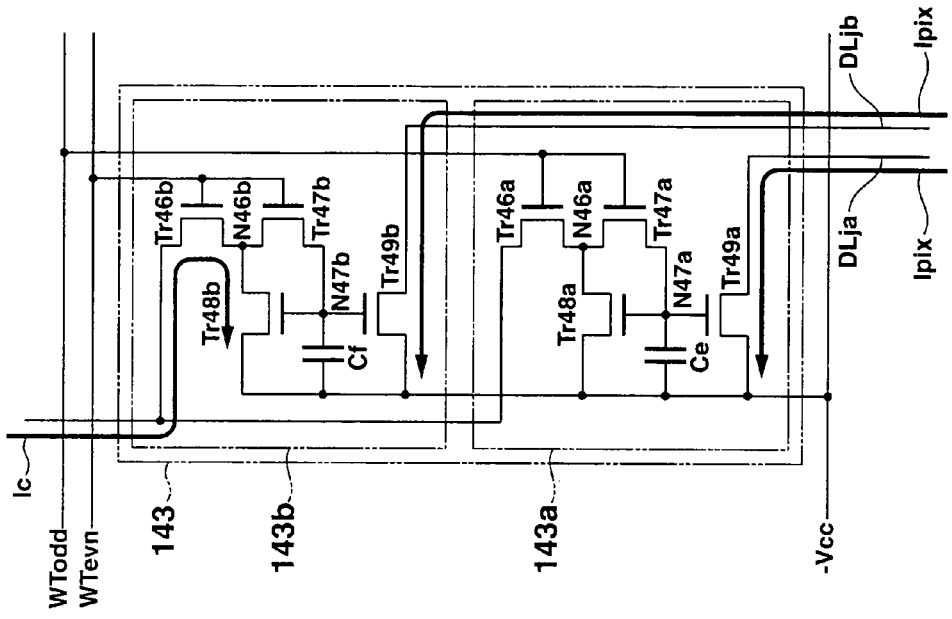
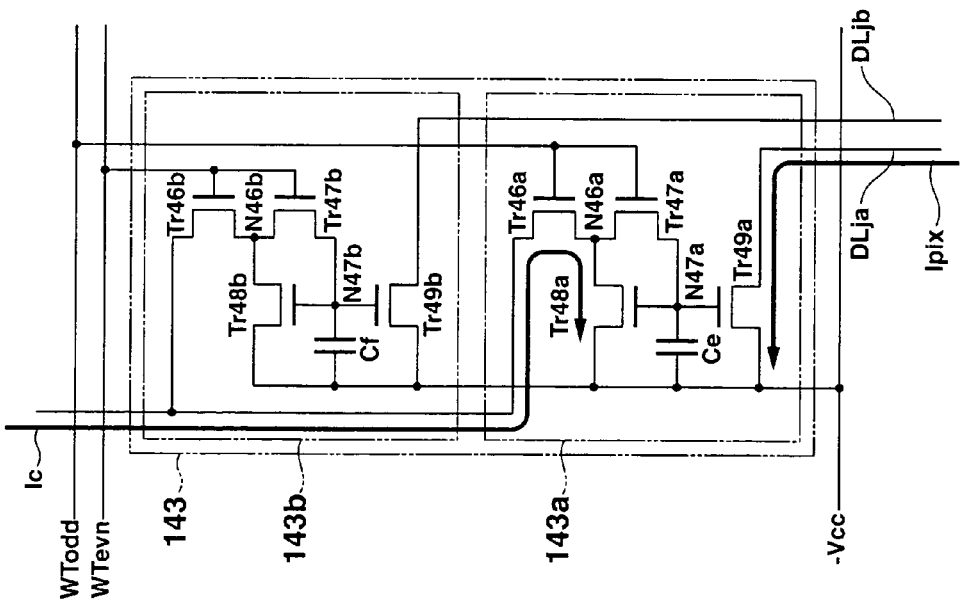

DISPLAY DRIVE APPARATUS IN WHICH DISPLAY PIXELS IN A PLURALITY OF SPECIFIC ROWS ARE SET IN A SELECTED STATE WITH PERIODS AT LEAST OVERLAPPING EACH OTHER, AND GRADATION CURRENT IS SUPPLIED TO THE DISPLAY PIXELS DURING THE SELECTED STATE, AND DISPLAY APPARATUS

CROSS-REFERENCE TO RELATED APPLICATIONS

This application is based upon and claims the benefit of priority from prior Japanese Patent Applications No. 2004-160140, filed May 28, 2004; and No. 2004-266441, filed Sep. 14, 2004, the entire contents of both of which are incorporated herein by reference.

BACKGROUND OF THE INVENTION

1. Field of the Invention

The present invention relates to a display drive apparatus, a display apparatus and a drive control method thereof, and more particularly to a display drive apparatus which can be applied to a display panel having a plurality of display pixels arranged therein, each display pixel comprising a current controlled type light emitting element which emits a light with a predetermined luminance gradation by supplying a current corresponding to display data thereto, and a display apparatus comprising the display drive apparatus, and a drive control method thereof.

2. Description of the Related Art

There has been conventionally known a light emitting element type display (a display apparatus) comprising a display panel in which display pixels each comprising a current controlled type light emitting element which emits a light with a predetermined luminance gradation in accordance with a current value of a drive current supplied thereto are two dimensionally arranged like an organic electroluminescence element (which will be referred to as an "organic EL element" hereinafter) or a light emitting diode (LED).

In particular, a light emitting element type display adopting an active matrix drive mode has a higher display response speed and no field angle dependence and can realize high luminance/high contrast, high definition of a display image quality, a reduction in power consumption and others as compared with a liquid crystal display apparatus (an LCD) which has greatly spread in recent years. Further, the light emitting element type display comprises light emitting element type display pixels and hence does not require a backlight like a liquid crystal display apparatus. Therefore, the light emitting element type display has very excellent characteristics that a further reduction in thickness and weight is possible, and it has been keenly studied and developed as a next-generation display.

FIG. 18 is a schematic view showing a structural example of a primary part of a light emitting element type display adopting an active matrix drive mode in a prior art.

FIG. 19 is an equivalent circuit diagram showing a structural example of a display pixel applied to the light emitting type display adopting the active matrix drive mode in the prior art.

As shown in FIG. 18, the light emitting element type display adopting the active matrix drive mode in the prior art has a structure comprising: a display panel 110P in which a plurality of display pixels EMP are arranged in a matrix form (n rows×m columns). Each display pixel EMP includes e.g., a later-described pixel drive circuit and a current controlled type light emitting element (e.g., an organic EL element) in the vicinity of each of intersections of a plurality of scanning lines SL and a plurality of data lines DL which are arranged to be substantially orthogonal to each other. A scanning driver 120P is connected to the scanning lines SL of the display panel 110P and sets the display pixels EMP in each row in a selected state by sequentially applying a scanning signal Vsel to each scanning line SL at a predetermined timing. A signal driver 200P is connected with the data lines DL of the display panel 110P, and fetches display data and supplies a gradation current Ipix corresponding to the display data to each data line DL at a predetermined timing.

In such a display, operating states of the scanning driver 120P and the signal driver 200P are controlled by, e.g., a scanning control signal, a data control signal and the like which are generated based on a timing signal supplied from the outside, and a gradation current corresponding to the display data is written in the display pixels in each row set in the selected state by application of the scanning signal. As a result, the respective display pixels emit lights with a predetermined luminance gradation, thereby displaying desired image information.

In such a light emitting element type display adopting the active matrix drive mode, various kinds of drive control mechanisms or control methods which control light emission of the above-described current controlled type light emitting elements have been proposed. For example, there has been known a display comprising a pixel drive circuit which is constituted of a plurality of switching means which control light emission of the light emitting elements as well as the light emitting elements in accordance with each display pixel constituting the display panel.

For example, as shown in FIG. 19, such a pixel drive circuit specifically comprises: a pixel drive circuit DP1; and an organic EL element OEL having an anode terminal connected to a drain terminal of a transistor Tr124 of the pixel drive circuit DP1 and a cathode terminal to which a ground potential is applied. The pixel drive circuit DP 1 includes in the vicinity of each intersection of a pair of scanning lines SL1 and SL2 arranged in parallel with each other and a data line DL: a first transistor Tr121 having a gate terminal connected to the scanning line SL1 and a source terminal and a drain terminal connected to the data line DL and a contact point N121; a second transistor Tr122 having a source terminal and a drain terminal connected to the contact point N121 and a contact point N122; a third transistor Tr123 having a gate terminal connected to the contact point N122, a drain terminal connected to the contact point N121, and a source terminal to which a high power supply voltage Vdd is applied; a fourth transistor Tr124 having a gate terminal connected to the contact point N122 and a source terminal to which the high power supply voltage Vdd is applied.

In this example, in FIG. 19, the first transistor Tr121 comprises an n-channel type field effect thin film transistor, and each of the second to fourth transistors Tr122 to Tr124 comprises a p-channel type field effect thin film transistor. Furthermore, CP1 represents a parasitic capacitance formed between a gate and a source of the third and fourth transistors Tr123 and Tr124.

In the pixel drive circuit DP1 having such a configuration, the organic EL element OEL is subjected to a light emission control as follows by turning on/off the four transistors (switching means) comprising the transistors Tr121 to Tr124 at a predetermined timing.

That is, in the pixel drive circuit DP1, when the display pixel is set in the selected state by respectively applying a high-level scanning signal Vsel1 to the scanning line SL1 and a low-level scanning signal Vsel2 to the scanning line SL2 by the scanning drive 120P, the transistors Tr121, Tr122 and Tr123 are turned on, and the gradation current Ipix corresponding to display data which has been supplied to the data line DL by the signal driver 200P flows through the transistors Tr121 and Tr123. At this moment, since a part between the gate and the drain of the transistor Tr123 is electrically short-circuited by the transistors Tr122 and Tr123 operates in a saturated region. As a result, a current level of the gradation current Ipix is converted into a voltage level by the transistor Tr123, and a predetermined voltage is thereby generated between the gate and the source (a write operation). The transistor Tr124 is turned on in accordance with the voltage generated between the gate and the source of the transistor Tr123, and a predetermined drive current flows to the ground potential from the high power supply voltage Vdd through the transistor Tr124 and the organic EL element OEL, thereby emitting a light from the organic EL element (a light emitting operation).

Subsequently, when, e.g., the high-level scanning signal Vsel2 is applied to the scanning line SL2, the transistor Tr122 is turned off. As a result, the voltage generated between the gate and the source of the transistor Tr123 is held by the parasitic capacitance CP1. Then, when the low-level scanning signal Vsel1 is applied to the scanning line SL1, the transistor Tr121 is turned off. As a result, the data line DL and the pixel drive circuit DP1 are electrically shut off. Consequently, the fourth transistor Tr124 continuously maintains the ON state by a potential difference based on the voltage held in the parasitic capacitance CP1, a predetermined drive current flows to the ground potential from the high power supply voltage Vdd through the transistor Tr124 and the organic EL element OEL, and hence the light emitting operation of the organic EL element OEL continues.

Here, the drive current supplied to the organic EL element OEL through the transistor Tr124 is controlled to have a current value based on a luminance gradation of the display data, and this light emitting operation is controlled to continue for, e.g., one frame period until a gradation current corresponding to the next display data is written in each display pixel.

The drive control method in the pixel drive circuit having such a circuit configuration supplies a gradation current having a specified current value corresponding to the display data to each display pixel (the gate terminal of the third transistor Tr123), and controls the drive current which is passed to the organic EL element based on a voltage held in accordance with the current value, thereby effecting the light emitting operation with a predetermined luminance gradation. Therefore, this method is called a current application mode (or a current specification mode).

Like FIG. 19, there has been also known a drive control method adopting a voltage application mode (or a voltage specification mode) which applies a gradation voltage having a specified voltage value corresponding to display data to each display pixel comprising a pixel drive circuit and an organic EL element, and controls a drive current which is passed to the organic EL element OEL in accordance with the voltage value of the gradation voltage, thereby effecting a light emitting operation with a predetermined luminance gradation. In a pixel drive circuit adopting such a voltage specification mode, irregularities or fluctuations (deterioration) are generated in element characteristics (a channel resistance of a transistor and others) of a switch element which has a selection function or a light emission drive function in dependence on an external environment (an ambient temperature and others), a utilization time and the like, a drive current is affected. Thus, the pixel drive circuit has a problem that desired light emission characteristics (display with a predetermined luminance gradation) cannot be stably realized for a long period in time. Alternatively, when each display pixel is finely formed in order to realize the high definition of the display panel, irregularities in operation characteristics (a current between the source and the drain of the transistor and others) of a switch element constituting the pixel drive circuit become large, and hence an appropriate gradation control cannot be performed. Accordingly, the pixel drive circuit has a drawback that generation of irregularities in light emission characteristics of each display pixel results in deterioration of a display image quality.

On the contrary, the pixel drive circuit adopting the current specification mode comprises a third transistor Tr123 (a current/voltage conversion transistor) which converts a current level of a gradation current corresponding to display data supplied to each display pixel into a voltage level and a fourth transistor Tr124 (a light emission drive transistor) which supplies a drive current having a predetermined current value to the organic EL element OEL. This pixel drive circuit can suppress an influence of irregularities in operation characteristics of the respective transistors Tr123 and Tr124 by setting a current value of a drive current supplied to the organic EL element OEL, and hence has an advantage that the problems of the pixel drive circuit adopting the voltage specification mode can be solved.

However, the pixel drive circuit adopting the current specification mode has the following problems.

In case of writing a gradation current based on display data having a lowest luminance or a relatively low luminance in each display pixel (at the time of low-gradation display), a signal current having a small current value corresponding to a luminance gradation of display data must be supplied to each display pixel.

Here, since an operation of writing a gradation current in each display pixel corresponds to charging a capacitance component which is parasitic on the data line (a retention capacitance constituting a wiring capacitance and a display pixel) to a predetermined voltage, a wiring length of the data line becomes long due to, e.g., an increase in size of the display panel. Moreover, when the number of display pixels connected to this data line is increased, a time required to charges the data line becomes long as a current value of the gradation current becomes small, i.e., as display is effected with a lower gradation, and hence a time required for a write operation with respect to each display pixel is increased. The write operation with respect to each display pixel cannot be completed in a preset write time, and there occurs a so-called insufficient write state in which a stable state (a saturation state) is not reached. As a result, there is a display pixel which cannot emit a light with an appropriate luminance gradation corresponding to display data, resulting in deterioration in a display image quality.

Additionally, when the number of scanning lines arranged on the display panel is increased and a selection period (i.e., a write time) of each scanning line is set short in order to realize the high definition of the display panel, the sufficient write operation with respect to each display pixel cannot be performed as a current value of the gradation current is reduced, and the insufficient write state is generated, which leads to deterioration in a display image quality or a restriction in high definition of the display panel.

BRIEF SUMMARY OF THE INVENTION

In a display drive apparatus which drives display pixels of a display panel based on display data and a display apparatus comprising this display drive apparatus, the present invention has an advantage that occurrence of an insufficient write state in an operation of writing a gradation current in each display pixel can be suppressed and the high definition of the display panel can be excellently realized.

In order to achieve the above-described advantage, according to one aspect of the present invention, there is provided a display drive apparatus which drives a plurality of two-dimensionally arranged display pixels constituting a display panel based on display data, the display drive apparatus comprising at least:

a selection circuit which sets the display pixels in a plurality of specific rows of the display panel in a selected state with periods at least overlapping each other;

a gradation signal generation circuit which generates a gradation signal which controls a luminance gradation of each display pixel based on the display data; and a current write circuit which fetches a signal current corresponding to the display pixels in the plurality of specific rows and supplies a gradation current having a current value based on the gradation signal to the display pixels in the plurality of specific rows in accordance with a timing of setting the display pixels in the selected state by the selection circuit.

The current write circuit is preferably formed with a conformation which is independent from the display panel, or constituted of a plurality of field effect thin film transistors each having an amorphous silicon semiconductor layer with a single channel polarity as a channel layer or a plurality of field effect thin film transistors each having a polysilicon semiconductor layer as a channel layer, and integrally formed to the display panel.

Preferably, the gradation signal generation circuit generates as the gradation signal a signal current which provides a luminance gradation corresponding to the display data to the display pixels, and the current write circuit has means for generating and outputting the gradation current having a current polarity reversed from that of the signal current supplied from the current generating section.

Preferably, the selection circuit has means for simultaneously setting display pixels in the plurality of specific rows of the display panel in a selected state based on a single selection signal, the current write circuit has means for simultaneously supplying the gradation current to display pixels in the plurality of specific rows in accordance with a timing at which the selection state is set by the selection signal, the gradation signal generation circuit has means for sequentially supplying the gradation signal corresponding to a plurality of display pixels in each column in display pixels in the plurality of specific rows to the current write circuit in time series, the current write circuit comprises a plurality of signal distribution circuits which are provided in accordance with each column of the display pixels in the plurality of specific rows and sequentially distribute the gradation signal supplied from the gradation signal generation circuit at a timing of time-series supply in accordance with the plurality of display pixels in each column, and a plurality of current holding circuits which individually hold the gradation signal distributed by the signal distributing section and simultaneously supply a current having a current value based on the held gradation signal as the gradation current to the display pixels in the plurality of specific rows. Each current holding circuit is provided with a plurality of stages of signal holding/outputting sections on a plurality of stages, the signal holding/outputting section comprising a signal holding section which holds a signal current distributed by the signal distribution circuit and a gradation current outputting section which outputs a current corresponding to the signal current held in the signal holding section as the gradation current in accordance with each of the plurality of display pixels in each column of the display pixels in the plurality of specific rows. An operation of fetching and holding the signal current by the signal holding portion on one of the plurality of stages of the signal holding/outputting sections is controlled to be simultaneously executed with an operation of outputting the gradation current from the gradation current outputting section on any other stage.

Preferably, the selection circuit has means for sequentially setting the display pixels corresponding to the plurality of specific rows in a selected state with the overlapping periods by sequentially applying a selecting signal which sets the display pixels in each row in the selected state to each of the plurality of specific rows of the display panel with the overlapping periods. The current write circuit has means for sequentially supplying the gradation current to each of the plurality of specific rows with the overlapping periods at a timing corresponding to application of the selection signal by the selection circuit. The gradation signal generation circuit has means for sequentially supplying the gradation signal corresponding to a plurality of display pixels in each column of the display pixels in the plurality of specific rows to the current write circuit in time series. The current write circuit comprises a plurality of current holding circuits which are provided in accordance with respective columns of the display pixels in the plurality of specific rows, sequentially hold the gradation signal supplied by the gradation signal generation circuit in accordance with the timing of time-series supply and sequentially supply a current having a current value based on the gradation signal as the gradation current to each of the plurality of specific rows. Each of the current holding circuits comprises a plurality of current holding/outputting sections in accordance with a plurality of display pixels in each column of display pixels in the plurality of specific rows, each of the current holding/outputting sections having a signal distributing section which distributes the signal current in accordance with the timing of time-series supply, a signal holding section which holds the signal current distributed by the signal distributing section, and a gradation current outputting section which outputs a current corresponding to the signal current held in the signal holding section as the gradation current. An operation of outputting the gradation current based on the signal current held in the signal holding section by the gradation current outputting section in one of the current holding/outputting sections and an operation of holding in the signal holding section in another current holding/outputting section the signal current distributed by the signal distributing section and outputting the gradation current based on the signal current held in the signal holding section by the gradation current outputting section are controlled to be simultaneously executed in the overlapping periods.

Preferably, the signal holding section comprises a charges storage circuit which stores electric charges based on the signal current and holds the electric charges as a voltage component, and the gradation current outputting section has a current mirror circuit configuration which generates and outputs as the gradation current a current having a current value which has a predetermined current ratio with respect to a current value corresponding to the gradation signal supplied from the gradation signal generation circuit.

In order to obtain the above-described advantage, according to another aspect of a display apparatus of the present invention, there is provided a display apparatus which displays image information based on display data, the display apparatus comprising at least:

a display panel which has a plurality of scanning lines arranged in a row direction and a plurality of data lines arranged in a column direction, and a plurality of display pixels arranged in a matrix form in the vicinity of intersections of the plurality of scanning lines and the plurality of data lines;

a scanning driver which sets the display pixels corresponding to a plurality of specific scanning lines which at least part of the plurality of scanning lines of the display panel in a selected state with periods at least overlapping each other; and a signal driver comprising a gradation signal generation circuit to which the display data is supplied and each generates a gradation signal which controls a luminance gradation of each display pixel based on the display data, and a current write circuit which fetches the signal current corresponding to the display pixels corresponding to the plurality of specific scanning lines and supplies a gradation current having a current value based on the gradation signal to the display pixels corresponding to the plurality of specific scanning lines in accordance with the timing of setting the display pixels in the selected state by the scanning driver.

Preferably, the signal driver has a conformation which is independent from the display panel, or the current write circuit in the signal driver is constituted by using a plurality of field effect thin film transistors in which an amorphous silicon semiconductor layer having a single channel polarity is a channel layer or a plurality of field effect thin film transistors in which a polysilicon semiconductor layer is a channel layer, and formed integrally with the display panel on a signal insulating substrate.

Preferably, the gradation signal generation circuit generates as the gradation signal a signal current which provides a luminance gradation corresponding to the display data to the display pixel. Further, the current write circuit in the signal driver has means for generating and outputting the gradation current whose current polarity is reversed from that of the signal current supplied from the current generating section.

The display pixel can comprise a pixel drive circuit which generates a predetermined drive current based on the gradation current output from the signal driver, and a current controlled type light emitting element which emits a light with a predetermined luminance gradation based on a current value of the drive current.

The pixel drive circuit can be configured by using a plurality of field effect thin film transistors in which an amorphous silicon semiconductor layer having a single channel polarity is a channel layer or a plurality of field effect thin film transistors in which a polysilicon semiconductor layer is a channel layer, and the light emitting element is, e.g., an organic electroluminescent element.

The display panel can have a plurality of data line groups in which a plurality of data lines corresponding to the number of scanning lines in each scanning line group among the plurality of data lines are determined as one set. Each data light group is arranged in accordance with each area between columns of the plurality of display pixels arranged in the matrix form in the display panel, and the display panel has a plurality of scanning line groups in which the plurality of specific scanning lines are determined as one set.

Preferably, the scanning driver has means for simultaneously setting the display pixels corresponding to the plurality of specific scanning lines in a selected state by applying to each scanning line group a single scanning signal which sets the display pixels in a selected state. The gradation signal generation circuit in the signal driver has means for sequentially supplying to the current write circuit in time series the gradation signal corresponding to the plurality of display pixels corresponding to each scanning line group in each data line in each data line group. The current write circuit in the signal driver comprises: a plurality of signal distribution circuits which are arranged in accordance with the respective data line groups and sequentially distribute the gradation signal supplied by the gradation signal generation circuit in accordance with each data line in each data line group at the timing of time-series supply; and a plurality of current holding circuits which individually hold the gradation signal distributed by the signal distributing section and simultaneously supply as the gradation current a current having a current value based on the held gradation signal to each data line in each data line group in accordance with a timing of applying the scanning signal to each scanning line group. Each current holding circuit is provided with signal holding/outputting sections on a plurality of stages, each signal holding/outputting section comprising a signal holding section which holds the gradation signal distributed by the signal distribution circuit and a gradation current outputting section which outputs as the gradation current a current having a current value based on the gradation signal held in the signal holding section in accordance with each data line in each data line group. An operation of fetching and holding the gradation signal by the signal holding section on one of the plurality of stages of the signal holding/outputting sections and an operation of outputting the gradation current from the gradation current output section on any other stage are controlled to be simultaneously executed.

Preferably, the scanning driver has means for sequentially setting the display pixels corresponding to the plurality of specific scanning lines in a selected state with the overlapping periods by sequentially applying a scanning signal which sets the display pixels in a selected state to each of the plurality of specific scanning lines with the overlapping periods. The current write circuit in the signal driver has means for sequentially supplying the gradation current to each data line in each data line group with the overlapping periods at a timing corresponding to application of the scanning signal by the scanning driver.

Preferably, the scanning driver has means for setting the display pixels corresponding to the plurality of specific scanning lines in a selected state with the overlapping periods by sequentially applying a scanning signal which sets the display pixels in a selected state to each of the plurality of specific scanning lines with the overlapping periods. The gradation signal generation circuit in the signal driver has means for sequentially supplying to the current write circuit in time series the gradation signal corresponding to the plurality of display pixels corresponding to the plurality of specific scanning lines in each data line in each data line group. The current write circuit comprises a plurality of current holding circuits which are provided in accordance with the respective data line groups, sequentially hold the gradation signal supplied by the gradation signal generation circuit in accordance with the timing of time-series supply and sequentially supply as the gradation current a current having a current value corresponding to the gradation signal to each data line in each data line group at the timing of application of the scanning signal. Each current holding circuit is provided with a plurality of current holding/outputting sections in accordance with respective data lines in each data line group, each current holding/outputting section comprising a signal distributing section which sequentially distributes the gradation signal in accordance with each data line in each data line group at the timing of time-series supply, a signal holding section which holds the gradation signal distributed by the signal distributing section, and a gradation current outputting section which outputs as the gradation current a current having a current value based on the gradation signal held in the signal holding section. An operation of holding the gradation signal distributed by the signal distributing section in the signal holding section and outputting the gradation current based on the gradation signal by the gradation current outputting section in one of the current holding/outputting sections and an operation of outputting the gradation current based on the gradation signal held in the signal holding section by the gradation current outputting section in any other current holding/outputting section are controlled to be simultaneously executed in the overlapping period.

The signal holding section can comprise a charges storage circuit which stores electric charges corresponding to the gradation signal and holds the electric charges as a voltage component. The gradation current outputting section can have a current mirror circuit configuration which generates and outputs as the gradation current a current having a current value with a predetermined current ratio with respect to a current value corresponding to the gradation signal supplied from the current generating section.

According to a drive method of the display apparatus in still another aspect of the present invention which achieves the above-described aim, the display pixels corresponding to a plurality of specific scanning lines which are at least part of the plurality of scanning lines in the display panel are set in a selected state with at least overlapping periods, thereby supplying the display data. A gradation signal which controls a luminance gradation of each display pixel is generated based on the display data. The gradation signal corresponding to the display pixels corresponding to the plurality of specific scanning lines is fetched. A gradation current having a current value based on the gradation signal is generated to be supplied to the display pixels corresponding to the plurality of specific scanning lines in accordance with a timing of setting the display pixels in the selected state. The display pixels in which the gradation current is supplied and written are operated with the display luminance based on the current value of the gradation current.

The operation of generating the gradation signal generates as the gradation signal a signal current which provides the luminance gradation corresponding to the display data to the display pixels. The operation of generating and outputting the gradation current having the current value based on the gradation signal can include an operation of generating a current having a current value with a predetermined current ratio with respect to the current value corresponding to the gradation signal and outputting the generated current as the gradation current.

The operation of setting the display pixels in the selected state can include an operation of simultaneously applying a single scanning signal which sets the display pixels in the selected state to the plurality of specific scanning lines so that the display pixels corresponding to the plurality of scanning lines can be simultaneously set in the selected state. The operation of supplying the gradation current can include an operation of simultaneously supplying the gradation current to the display pixels corresponding to the plurality of scanning lines. The operation of simultaneously supplying the gradation current to the display pixels corresponding to the plurality of scanning lines can include an operation which simultaneously executes an operation of fetching and holding the gradation signal corresponding to each scanning line and an operating of outputting the gradation current based on the gradation signal fetched and held at the foregoing timing.

Preferably, the operation of setting the display pixels in the selected state sequentially applies the scanning signal which sets the display pixels in the selected state to each of the plurality of specific scanning lines with the overlapping periods so that the display pixels corresponding to the plurality of scanning lines are sequentially set in the selected state with the overlapping periods. The operation of supplying the gradation current includes an operation of sequentially supplying the gradation current to the display pixels corresponding to each of the plurality of scanning lines with the overlapping periods at the timing of application of the scanning signal. The operation of sequentially supplying the gradation current to the display pixels corresponding to the plurality of scanning liens simultaneously executes with the overlapping periods an operation of holding the gradation signal and outputting the gradation current based on the gradation signal and an operation of outputting the gradation current based on the gradation signal held at the foregoing timing.

BRIEF DESCRIPTION OF THE SEVERAL VIEWS OF THE DRAWING

FIGS. 5A and 5B are conceptual views showing a schematic operation of the current holding/distributing section which can be applied to the embodiment depicted in FIG. 1;

FIGS. 11A and 11B are conceptual views showing a schematic operation of the current holding/distributing section which can be applied to the embodiment depicted in FIG. 9;

DETAILED DESCRIPTION OF THE INVENTION

A display apparatus and a drive control method thereof according to the present invention will now be described hereinafter based on illustrated embodiments.

First Embodiment of Display Apparatus

A schematic configuration of a display apparatus to which a display drive apparatus according to the present invention can be applied will be first described.

Figure 1:
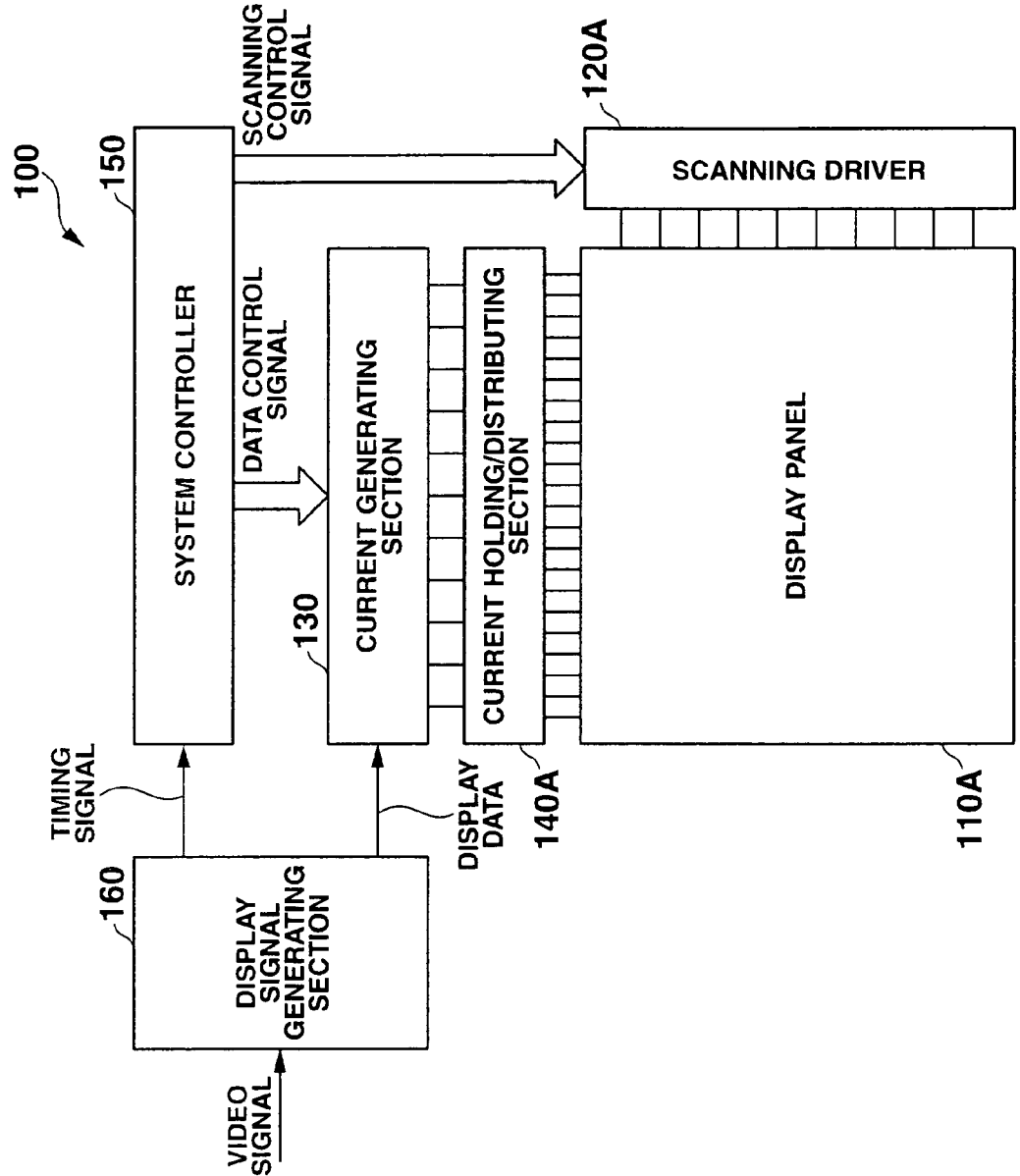
FIG. 1 is a schematic block diagram showing an entire configuration of a display apparatus according to an embodiment of the present invention.

FIG. 1 is a schematic block diagram showing an entire configuration of a display apparatus according to an embodiment of the present invention.

Figure 2:
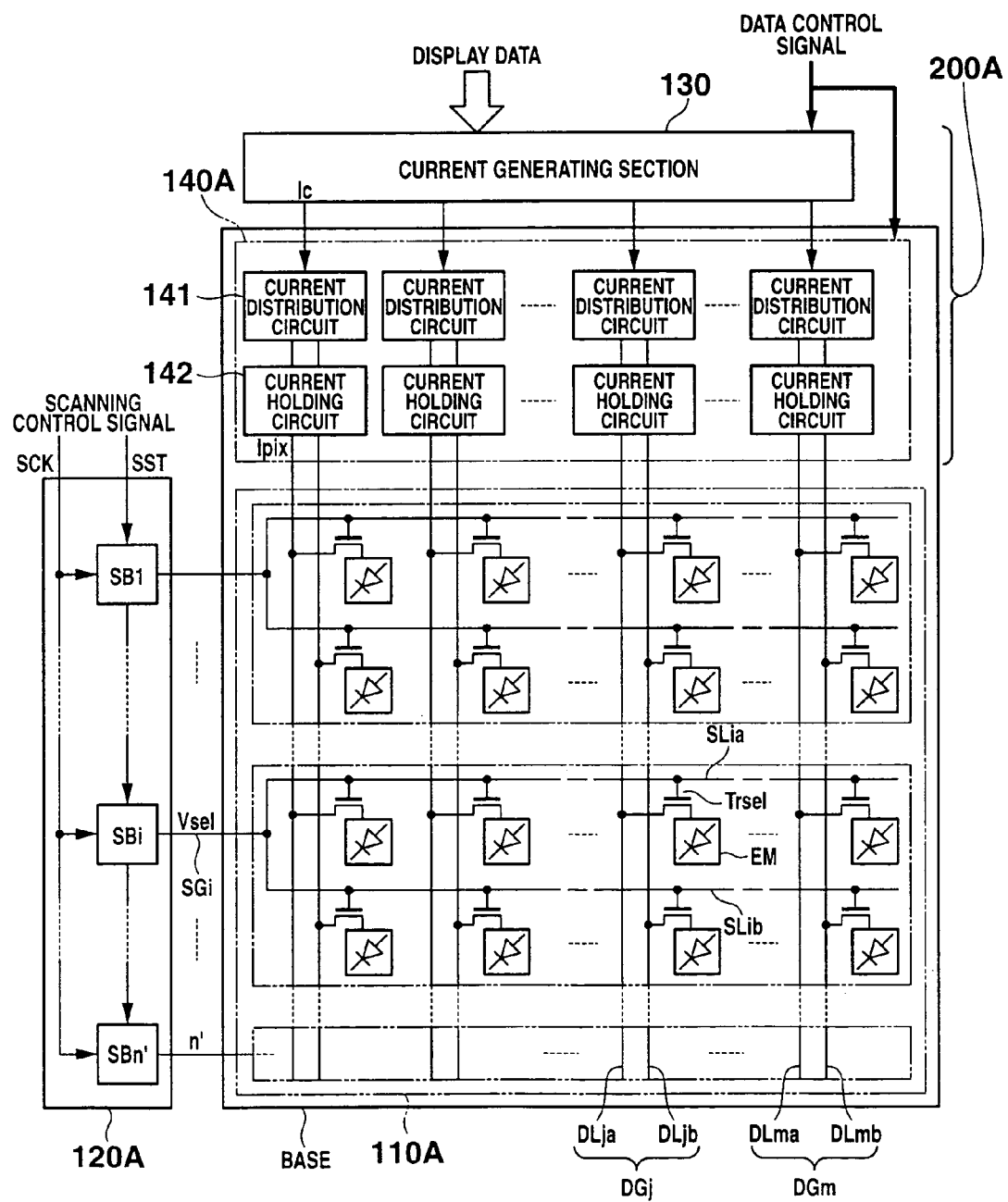
FIG. 2 is a structural view showing a part of the display apparatus according to the embodiment depicted in FIG. 1.

FIG. 2 is a structural view showing a primary part of the display apparatus according to this embodiment.

As shown in FIG. 1, a display apparatus 100 according to the present invention roughly has a display panel 110A, a scanning driver (a selection circuit) 120A, a current generating section (a gradation signal generation circuit) 130, a current holding/distributing section (a current write circuit) 140A, a system controller 150 and a display signal generating section 160.

As shown in FIG. 2, the display panel 110A substantially has a plurality of display pixels EM which are two-dimensionally arranged (n rows×m columns) and connected to selection transistors Trsel. A plurality of scanning line groups SGi are arranged in accordance with the display pixels EM in a plurality of rows (two rows in this embodiment) and in which a plurality of (two in this embodiment) scanning lines SLia and SLib (i is a positive integer falling within a range of $1 \leq i \leq n'$, e.g., a divisor of the total number n of rows provided in the display panel 110A; n' and n are positive integers) are determined as one set. A plurality of data line groups DGj are arranged in accordance with the display pixels EM in each column corresponding to each scanning line groups SGi and in which a plurality of (two in this embodiment) data lines DLja and DLjb (j is a positive integer falling within a range of $1 \leq j \leq m$; m is a positive integer and the total number of pixel columns set in the display panel 110) are determined as one set. Each display pixel EM is provided in the vicinity of each intersection of the scanning lines SLia and SLib constituting each scanning line group SGi and the data lines DLja and DLjb constituting each data line group DGj.

The scanning driver (the selection circuit) 120A is generally connected with the scanning line groups SGi of the display panel 110A, and sequentially applies a scanning signal Vsel to each scanning line group SGi at a predetermined timing to simultaneously set the display pixels EM corresponding to a plurality of rows (two rows in this embodiment) connected to the scanning line group SGi.

The current generating section (the gradation signal generation circuit) 130 generally fetches display data corresponding to the display pixels corresponding to a plurality of rows (two rows in this embodiment) of the scanning line group SGi supplied from the later-described display signal generating section 160, and sequentially supplies a signal current (a gradation signal) Ic for the plurality of corresponding rows to the current holding/distributing section 140A in time series.

The current holding/distributing section (the current write circuit) 140A is generally connected with each data line group DGj of the display panel 110A, distributes the signal current Ic corresponding to a plurality of rows (two rows in this embodiment) sequentially supplied from the current generating section 130 in time series at a predetermined timing and holds this current in accordance with each row, and simultaneously supplies a gradation current Ipix based on the held signal current Ic to the display pixels EM in a plurality of rows (two rows in this embodiment). In this embodiment, the current generating section 130 and the current holding/distributing section 140A constitute a signal driver 200A.

The system controller 150 generates and outputs a scanning control signal and a data control signal which control operating states of at least the scanning driver 120A, the current generating section 130 and the current holding/distributing section 140A based on, e.g., a timing signal supplied from the display signal generating section 160.

The display signal generating section 160 generates display data (e.g., digital data) based on, e.g., a video signal supplied from the outside of the display apparatus 100 and supplies the display data to the current generating section 130, further generates or extracts a timing signal (a system clock or the like) which displays as an image the display data in the display panel 110A and supplies this timing signal to the system controller 150.

In the configuration shown in FIG. 2, as a structural example, the current holding/distributing section 140A is integrally formed with a pixel array on an insulating substrate BASE on which the plurality of display pixels EM (i.e., the pixel array) constituting the display panel 110A are formed, but the present invention is not restricted to this configuration. For example, the signal driver 200A may have a conformation of a driver chip and be mounted (packaged) on the substrate BASE.

A concrete configuration of each structure will now be described.

(Display Panel)

For example, as shown in FIG. 2, the display panel 110A which can be applied to the display apparatus according to this embodiment has a configuration in which each scanning line group SGi corresponding to two rows in which two diverging scanning lines SLia and SLib are determined as one set and each data line group DGj corresponding to one pixel column in which two data lines DLja and DLjb are determined as one set are arranged to be orthogonal to each other. Each display pixel EM is connected to each intersection of each scanning line SLia and each data line DLja and an intersection of each scanning line SLib and each data line DLjb.

In this embodiment, in the configuration shown in FIG. 2, the display pixels EM in odd-numbered rows are connected to the scanning line SLia in each scanning line group SGi, and the display pixels EM in even-numbered rows are connected to the scanning line SLib.

As shown in FIG. 2, as to the number of rows corresponding to the scanning lines constituting each scanning line group SGi, the present invention is not restricted to the configuration in which each scanning line group SGi corresponds to the display pixels EM for two rows. For example, it is possible to adopt a configuration in which each scanning line group SGi corresponds to the display pixels EM for k rows (k is a divisor of the total number n of rows provided in the display panel 110) and which has n/k sets (that is, n' sets mentioned above) of scanning line groups alternately, there may be used a configuration in which one (single) scanning line group is provided in accordance with rows (n rows) constituting the display panel 110A and all the display pixels EM for one screen are connected with the scanning line group in common, for example. In this case, all the display pixels EM for one screen are altogether set in a selected state by a single scanning signal output from the scanning driver 120A.

Each display pixel EM has a gate terminal connected with each scanning line SLia or SLib and a source terminal connected with a drain terminal of each selection transistor Trsel connected with each data line DLja or DLjb. Each display pixel EM includes a current controlled type light emitting element which emits a light with a predetermined luminance gradation based on a gradation current Ipix supplied from the current holding/distributing section 140 through each data line DLja or DLjb and the selection transistor Trsel.

In the display panel 110A having such a configuration, by applying a scanning signal Vsel to a specific scanning line group SGi from the later-described scanning driver 120A, the selection transistors Trsel connected to the plurality of (two) scanning lines SLia and SLib constituting the scanning line group SGi are simultaneously turned on, and the display pixels EM corresponding to the plurality of row (two rows) are altogether set in the selected state. In the state where the scanning signal Vsel is applied to the specific scanning line group SGi (the selected state), by supplying the gradation current Ipix corresponding to display data to each data line group DGj from the later-described current generating section 130 and the current holding/distributing section 140A all at once, the display data is written in the display elements EM corresponding to the plurality of rows (two rows) which are set in the selected state at the same time through the selection transistors Trsel which has been turned on. A concrete circuit example or a circuit operation of the display pixel EM including the selection transistor will be described later in detail.

(Scanning Driver)

The scanning driver 120A simultaneously sets the display pixels EM corresponding to the plurality of rows (two rows in this embodiment) connected to the scanning lines SLia and SLib constituting each scanning line group SGi in the selected state by executing the operation of sequentially applying the scanning signal Vsel which is in a selection level (e.g., a high level) to each scanning line group SGi based on a scanning control signal supplied from the system controller 150. That is, for example, as shown in FIG. 2, the scanning driver 120A comprises shift blocks SB1, SB2, . . . SBi, . . . SBn' each including a shift register and a buffer on a plurality of stages (in FIG. 2, n'=n/2; n is the total number of rows provided in the display panel 110A) in accordance with the respective scanning line groups SGi. A shift signal which is output while sequentially shifting from the upper part to the lower part of the display panel 110A by the shift registers is sequentially applied to each scanning line group SGi as the scanning signal Vsel having a predetermined selection level (a high level) through the buffers based on the scanning control signal (a scanning start signal SST, a scanning clock signal SCK and the like) supplied from the later-described system controller 150.

As described above, for example, when there is adopted the configuration in which all the display pixels EM constituting the display panel 110A are connected to the single line group SGi, such shift blocks as shown in FIG. 2 are not necessary, and all the display pixels EM for one screen are altogether set in the selected state by applying the single scanning signal Vsel to the scanning line group SGi based on the scanning control signal at a predetermined timing.

(Current Generating Section)

The current generating section 130 sequentially fetches display data corresponding to the display pixels for the plurality of rows (two rows in this embodiment) in the data line group DGj corresponding to the scanning line group SGi supplied from the later-described display signal generating section 160 based on a data control signal fed from the system controller 150 at a predetermined timing to generate a signal current (a gradation signal) Ic having a current value corresponding to a gradation value of the display data, and sequentially supplies the signal current Ic for the plurality of rows to the current holding/distributing section 140A in accordance with each column in time series. The current generating section 130 sequentially and repeatedly executes this operation for one screen. The concrete configuration and operation of the current generating section 130 will be described later in detail.

(Current Holding/Distributing Section)

The current holding/distributing section 140A sequentially fetches the signal current Ic for the plurality of rows corresponding to each scanning line group SGi supplied from the current generating section 130 in time series based on the data control signal fed from the system controller 150 at a predetermined timing, individually holds the signal current Ic in accordance with the plurality of display pixels EM in each column of each data line group DGj, and simultaneously supplies a gradation current Ipix based on the held signal current Ic to the display pixels EM for the plurality of rows (two rows in this embodiment) of each data line group DGj in accordance with a timing of setting each scanning line group SGi in the selected state by using the above-described scanning driver 120.

Specifically, for example, as shown in FIG. 2, the current holding/distributing section 140A comprises at least a plurality of current distribution circuits 141 each of which is provided in accordance with each data line group DGj arranged in the display panel 110A, and distributes the signal current Ic supplied from the current generating section 130 in time series in accordance with each of the plurality of (two in this embodiment) data lines DLja and DLjb of each data line group DGi, and a plurality of current holding circuits 142 each of which is provided to be connected with each data line group DGj arranged in the display panel 110A and holds the signal current Ic corresponding to the plurality of (two in this embodiment) data lines distributed by the current distribution circuit 141 in parallel.

This current holding/distributing section 140A sequentially fetches the signal current Ic for the plurality of rows (two rows in this embodiment) connected with the scanning lines SLia and SLib constituting each scanning line group SGi at a timing based on the data control signal, and distributes and holds the signal current Ic in accordance with each data line in each data line group SGi. The section 140A also generates a gradation current Ipix based on the held signal current Ic, and simultaneously supplies the gradation current Ipix to the display pixels EM for the plurality of rows (two rows in this embodiment) through each data line group DGi at a timing of setting the scanning line group SGi in the selected state. The concrete configuration and operation of the current holding/distributing section 140A will be described later in detail.

(System Controller)

The system controller 150 allows the scanning driver 120A, the current generating section 130 and the current holding/distributing section 140A to operate at a predetermined timing in order to generate/output the scanning signal Vsel, the signal current Ic and the gradation current Ipix by outputting the scanning control signal and the data control signal which control the operating states to the scanning driver 120A and the current generating section 130 and to the current holding/distributing section 140 through this current generating section 130, writes display data generated by the display signal generating section 160 in each display pixel EM to emit a light therefrom, and controls the display panel 110A to display predetermined image information based on a video signal.

(Display Signal Generating Section)

The display signal generating section 160 extracts a luminance gradation signal component from, e.g., a video signal supplied from the outside of the display apparatus 100, and supplies the luminance gradation signal component to the current generating section 130 as display data in accordance with each row of the display panel 110A. In this embodiment, when the video signal includes a timing signal component which defines a display timing of image information like a television broadcast signal (a composite video signal), the display signal generating section 160 may have the function of extracting the luminance gradation signal component as well as a function of extracting a timing signal component and supplying it to the system controller 150. In this case, the system controller 150 generates a scanning control signal and a data control signal which are supplied to the scanning driver 120A, the current generating section 130 or the current holding/distributing section 140 based on a timing signal supplied from the display signal generating section 160.

<Concrete Example of Current Generating Section>

A concrete structural example of the current generating section which can be applied to the display apparatus according to this embodiment will now be described.

Figure 3:
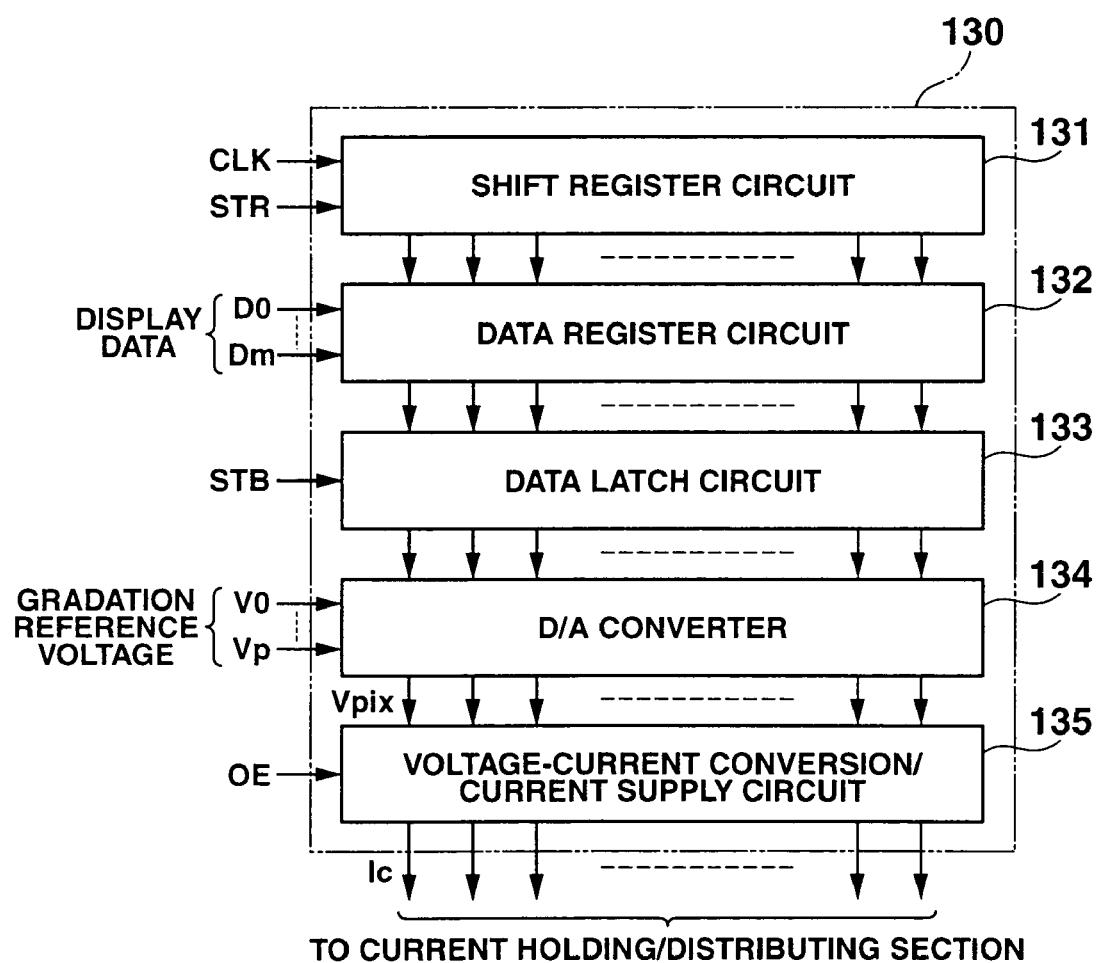
FIG. 3 is a block diagram showing a structural example of a current generating section which can be applied to the display apparatus according to the embodiment depicted in FIG. 1.

FIG. 3 is a block diagram showing a structural example of the current generating section which can be applied to the display apparatus according to this embodiment.

For example, as shown in FIG. 3, the current generating section 130 has includes a shift resister circuit 131, a data resister circuit 132, a data latch circuit 133, a D/A converter 134, and a voltage-current conversing/current supply circuit 135. The shift register circuit 131 outputs a shift signal while sequentially shifting a sampling start signal STR based on a shift clock signal CLK supplied as a data control signal from the system controller 150. The data register circuit 132 sequentially fetches display data D0 to Dm (digital data) for one row supplied from the display signal generating section 160 based on an input timing of the shift signal. The data latch circuit 133 holds the display data D0 to Dm for one row fetched by the data register circuit 132 based on a data latch signal STB. The D/A converter 134 converts the held display data D0 to Dm into a predetermined analog signal voltage (a gradation voltage Vpix) based on gradation reference voltages V0 to Vp supplied from non-illustrated power supplying means. The voltage-current conversion/current supply circuit 135 which generates a signal current (a gradation signal) Ic corresponding to the display data converted into the analog signal voltage, and sequentially supplies to the current holding/distributing section 140A in time series a signal current Ic corresponding to the display pixels EM in each column for the plurality of rows connected to each scanning line group SGi based on an output enable signal OE supplied from the system controller 150 in accordance with each data line group DGj arranged in the display panel 110.

<Concrete Example of Current Holding/Distributing Section>

A concrete example of the current holding/distributing section which can be applied to the display apparatus according to this embodiment will now be described.

Figure 4:
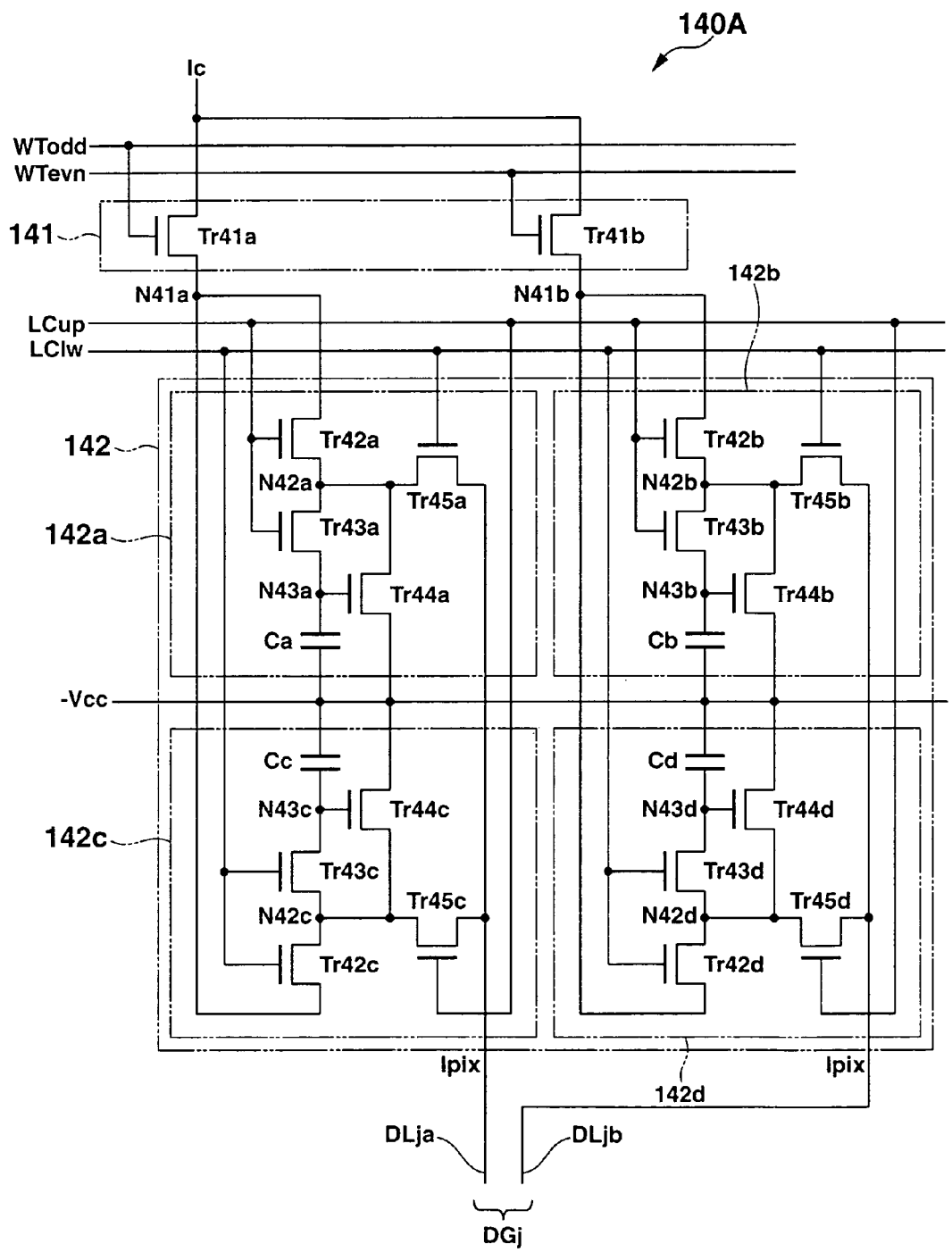
FIG. 4 is a circuit block diagram showing a structural example of a current holding/distributing section which can be applied to the display apparatus according to the embodiment depicted in FIG. 1.

FIG. 4 is a circuit block diagram showing a structural example of the current holding/distributing section which can be applied to the display apparatus according to this embodiment.

In this example, just a structural example which can be applied to the display apparatus according to this embodiment is illustrated, and the present invention is not restricted to this circuit configuration.

For example, as shown in FIG. 4, each current distribution circuit (a signal distributing section) 141 constituting the current holding/distributing section 140A comprises a switch transistor Tr41a and a switch transistor Tr41b. In the switch transistor Tr41a, the signal current Ic output from the current generating section 130 is supplied to one end side (a source terminal) of a current path, the other end side (a drain terminal) of the current path is connected with a first output contact point N41a extending to the current holding circuit 142, and a first current fetch signal WTodd supplied as a data control signal from the system controller 150 is applied to a control terminal (a gate terminal). In the switch transistor Tr41b, a signal current Ic output from the current generating section 130 is supplied to one end side (a source terminal) of a current path, the other end side (a drain terminal) of the current path is connected with a second output contact point N41b extending to the current holding circuit 142, and a second current fetch signal WTevn supplied as a data control signal is applied to a control terminal (a gate terminal).

Each current holding circuit 142 constituting the current holding/distributing section 140A has a configuration in which latch sections (signal holding/outputting sections) 142a and 142c on two stages which are connected with the data line DLja in parallel in common and to which the signal current Ic output from the current distribution circuit 141 through the first output contact point N41a is supplied in common are provided in parallel with latch sections (signal holding/outputting sections) 142b and 142d on two stages which are connected with the data line DLjb in common and to which the signal current Ic output from the current distribution circuit 141 through the second output contact point N41b is supplied in common.

For example, as shown in FIG. 4, each latch section 142a (or 142c) comprises: a transistor Tr42a (or Tr42c) which has a current path (a source—a drain) connected between the output contact point N41a and the contact point N42a (or N42c) of the current distribution circuit 141 and has a control terminal (a gate) to which a first latch signal LCup (or a second latch signal LClw) is applied; a transistor Tr43a (or Tr43c) which has a current path connected between the contact point N42a (or N42c) and the contact point N43a (or N43c) and has a control terminal to which a first latch signal LCup (or a second latch signal LClw) is applied; a transistor Tr44a (or Tr44c) in which one end side of a current path is connected with the contact point N42a (or N42c) while a predetermined low-potential voltage (−Vcc) is applied to the other end side of the same and a control terminal is connected with the contact point N43a (or N43c); a transistor Tr45a (or Tr45c) in which one end side of a current path is connected with the contact point N42a (or N42c) while the other end side of the same is connected with the data line DLja and a second latch signal LClw (or a first latch signal LCup) is applied to a control terminal; and a storage capacitance Ca (or Cc) connected between the contact point N43a (or N43c) and the low-potential voltage (−Vcc).

For example, as shown in FIG. 4, like the latch sections 142a and 142c, each latch section 142b (or 142d) mentioned above comprises: a transistor Tr42b (or Tr42d) in which a current path (a source—a drain) is connected between the output contact N41b of the current distribution circuit 141 and the contact point N42b (or N42d) and a first latch signal LCup (or a second latch signal LClw) is applied to a control terminal (a gate); a transistor Tr43b (or Tr43c) in which a current path is connected between the contact point N42b (or N42d) and the contact point N43b (or N43d) and a first latch signal LCup (or a second latch signal LClw) is applied to a control terminal; a transistor Tr44b (or Tr44d) in which one end side of a current path is connected with the contact point N42b (or N42d) while a predetermined low-potential voltage (−Vcc) is applied to the other end side of the same, and a control terminal is connected with the contact point N43b (or N43d); a transistor Tr45b (or Tr45d) in which one end side of a current path is connected with the contact point N42b (or N42d) while the other end side of the same is connected with the data line DLjb, and a second latch signal LClw (or a first latch signal LCup) is applied to a control terminal; and a storage capacitance Cb (or Cd) connected between the contact point N43b (or N43d) and the low-potential voltage (−Vcc).

In this example, although the respective transistors Tr41a, Tr41b in the current distribution circuit 141 according to this embodiment and the respective transistors Tr42a to Tr45a, Tr42b to Tr45b, Tr42c to Tr45c and Tr42d to Tr45d in the current holding circuit 142 are not restricted to specific types, it is possible to apply an n-channel type field effect thin film transistor in which an amorphous silicon layer is a channel layer or a field effect thin film transistor in which a polysilicon layer is a channel layer, for example. In this case, as shown in FIG. 2, the current holding/distributing section 140A can be integrally formed with the pixel array on an insulating substrate BASE constituting the display panel 110A. Further, each of the storage capacitances Ca to Cd provided in the respective latch sections 142a to 142d may be a parasitic capacitance formed between the gate and the source of each of the transistors Tr44a to Tr44d or an individually provided capacitance element.

In the above-described current holding circuit 142, the storage capacitances Ca to Cd constitute the signal holding section and the charges storage circuit according to the present invention, and the transistors Tr44a to Tr44d and Tr45a to Tr45d constitute the gradation current outputting section according to the present invention.

<Operations of Current Holding/Distributing Section>

Operations in the current holding/distributing section having such a configuration will now be described.

FIGS. 5A and 5B are conceptual views showing general operations of the current holding/distributing section which can be applied to this embodiment.

In this example, of the latch sections 142a to 142d constituting each current holding circuit 142, the illustration and description will be given as to the side where the latch sections 142 and 142c are provided for the convenience' sake, but the same operations are executed on the side where the latch sections 142b and 142d are provided.

Operations in the current holding/distributing section 140A (the current distribution circuit 141 and the current holding circuit 142) according to this embodiment has: a current distributing operation of distributing a signal current (a gradation signal) Ic which is supplied from the current generating section 130 in time series and based on display data written in the display pixels for the plurality of rows (two rows in this embodiment) corresponding to the respective scanning lines SLia and SLib constituting the scanning line group SGi to the output contact point N41a side and the output contact point N41b side by the current distribution circuit 141; a current holding operation of fetching and holding the distributed signal current Ic in either the latch sections 142a and 142b or the latch sections 142c and 142d constituting the current holding circuit 142 in synchronization with the current distributing operation; and a current output operation of simultaneously outputting the gradation current Ipix based on the signal current Ic held in the current holding operation to the respective data lines DLja and DLjb constituting the data line group DGj from the other one of the latch sections 142a and 142b and the latch sections 142c and 142d constituting the current holding circuit 142 in synchronization with the current holding operation. The current holding operation and the current output operation are controlled to be alternately repeatedly executed between the latch sections 142a and 142b and the latch sections 142c and 142d constituting the current holding circuit 142 while repeating the current distributing operation in accordance with all the scanning line groups SGi in the display panel 110A.

That is, in a period where the signal current Ic supplied from the current generating section 130 based on the display data in accordance with each column is fetched and held on one latch section side constituting the current holding circuit 142, the gradation current Ipix is read and output from the other latch section side at the same time. Therefore, the operation of fetching the signal current Ic based on the display data and outputting the gradation current Ipix to the data line group DGj of each column is substantially executed.

Each of the operations will now be concretely described with reference to each circuit configuration of the current holding/distributing section.

(Current Distributing Operation)

In the current distributing operation, by selectively setting first and second current fetch signals WTodd and WTevn supplied as data control signals from the system controller 150 to the high level in the current distribution circuit 141, one of the switches Tr41a and Tr41b is sequentially turned on, and the signal current Ic corresponding to the display pixels EM in each row is output from the current generating section 130 in time series in synchronization with the timing of turning on the switch. As a result, the signal current Ic is distributed in accordance with each row and output to the individual latch sections 142a and 142c or 142b and 142d constituting the later-described current holding section 142 through each output contact point N41a or N41b.

(Current Holding Operation/Current Output Operation)

In the current holding circuit 142 (the latch sections 142a to 142d), by selectively setting first and second latch signals LCup and LClw supplied as data control signals from the system controller 150 to the high level, one (the latch sections 142a and 142b or the latch sections 142c and 142d) of the latch sections 142a and 142c connected with the output contact point N41a in parallel and the latch sections 142b and 142d connected with the output contact point N41b in parallel is set in a current holding operation state, and the remaining latch sections (the latch sections 142c and 142d or the latch sections 142a and 142b) are set in a later-described current output operation state.

In the current holding operation, as shown in FIG. 5A (the latch sections 142a and 142c alone are illustrated for the convenience's sake), the first latch signal LCup is set to the high level, and the second latch signal LClw is set to the low level. As a result, in the latch section 142a connected with the output contact point N41a, the transistors Tr42a, Tr43a and Tr44a are turned on, and the transistor Tr45a is turned off. At this time, since the part between the gate and the drain of the transistor Tr44a is electrically short-circuited by the transistor Tr43a, the transistor Tr44a operates in a saturation region. Consequently, the signal current Ic supplied from the current generating section 130 and output to the output contact point N41a through the switch Tr41a of the current distribution circuit 141 flows to the low-potential voltage (−Vcc) side through the transistors Tr42a and Tr44a of the latch section 142a, and a current level of the signal current Ic is converted into a voltage level between the gate and the source of the transistor Tr44a so that the signal current Ic is stored as the electric charges in the storage capacitance Ca.

In the current output operation, as shown in FIG. 5B, the first latch signal LCup is set to the low level, and the second latch signal LClw is set to the high level. As a result, the transistors Tr42a and Tr43a are turned off and the transistor Tr45a is turned on in the latch section 142a. At this time, a potential (a high voltage) based on the electric charges (the signal current Ic) stored in the storage capacitance Ca by the current holding operation is held in the contact point N43a, and hence the transistor Tr44a continues the ON operation. Consequently, the data line DLja arranged in the display panel 110 (not shown) is connected with the low-potential voltage (−Vcc) through the transistors Tr45a and Tr44a of the latch section 142a, and the gradation current Ipix flows in such a manner that it is drawn from the data line DLja side (i.e., the display pixel EM side) toward the latch section 142a (the current holding circuit 142).

Further, in a state where the first latch signal LCup is set to the low level and the second latch signal LClw is set to the high level (i.e., the current output operation state of the latch section 142a mentioned above), the transistors Tr42c and Tr43c are turned on, the part between the gate and the drain of the transistor Tr44c is electrically short-circuited by the transistor Tr43a so that the transistor Tr44c is turned on in the saturation region and the transistor Tr45c is turned off in the latch section 142c connected with the output contact point N41a in parallel. Therefore, the signal current Ic output to the output contact point N41a flows to the low-potential voltage (−Vcc) side through the transistors Tr42c and Tr44c of the latch section 142c, and a current level of the signal current Ic is converted into a voltage level between the gate and the source of the transistor Tr44c so that the signal current Ic is stored as the electric charges in the storage capacitance Cc.

That is, in a period that one of the latch sections 142a and 142c is set in the current holding operation state, the other one is simultaneously set in the current output operation state. Such an operation state is likewise executed in a combination of the non-illustrated latch sections 142b and 142d.

The description has been given as to the example where the function (a current polarity reversing section) which generates (converts a current direction) the negative gradation current Ipix corresponding to the signal current Ic with the positive polarity supplied from the current generating section 130 is provided and the gradation current Ipix is drawn from the data line (the display pixels) side in order to cope with the circuit configuration of the later-described pixel drive circuit provided to the display pixel EM in the current holding/distributing section 140A according to this embodiment. However, the present invention is not restricted thereto, and it may have a configuration in which the gradation current Ipix with the positive polarity is generated and the gradation current Ipix is passed to the data line (the display pixels) in accordance with a circuit configuration of the display pixels EM.

It is to be noted that nearly all known current driver circuits (corresponding to the current generating section) which are distributed and available in the marketplace have a configuration of outputting the gradation signal (the signal current) Ic having the positive polarity, and hence the gradation current whose current direction is converted can be readily generated by known current drivers by applying the current holding/distributing section having the above-described configuration.

<Drive Control Method of Display Apparatus>

A drive control operation (a drive control method) in the display apparatus having the above-mentioned configuration will now be described.

Figure 6:
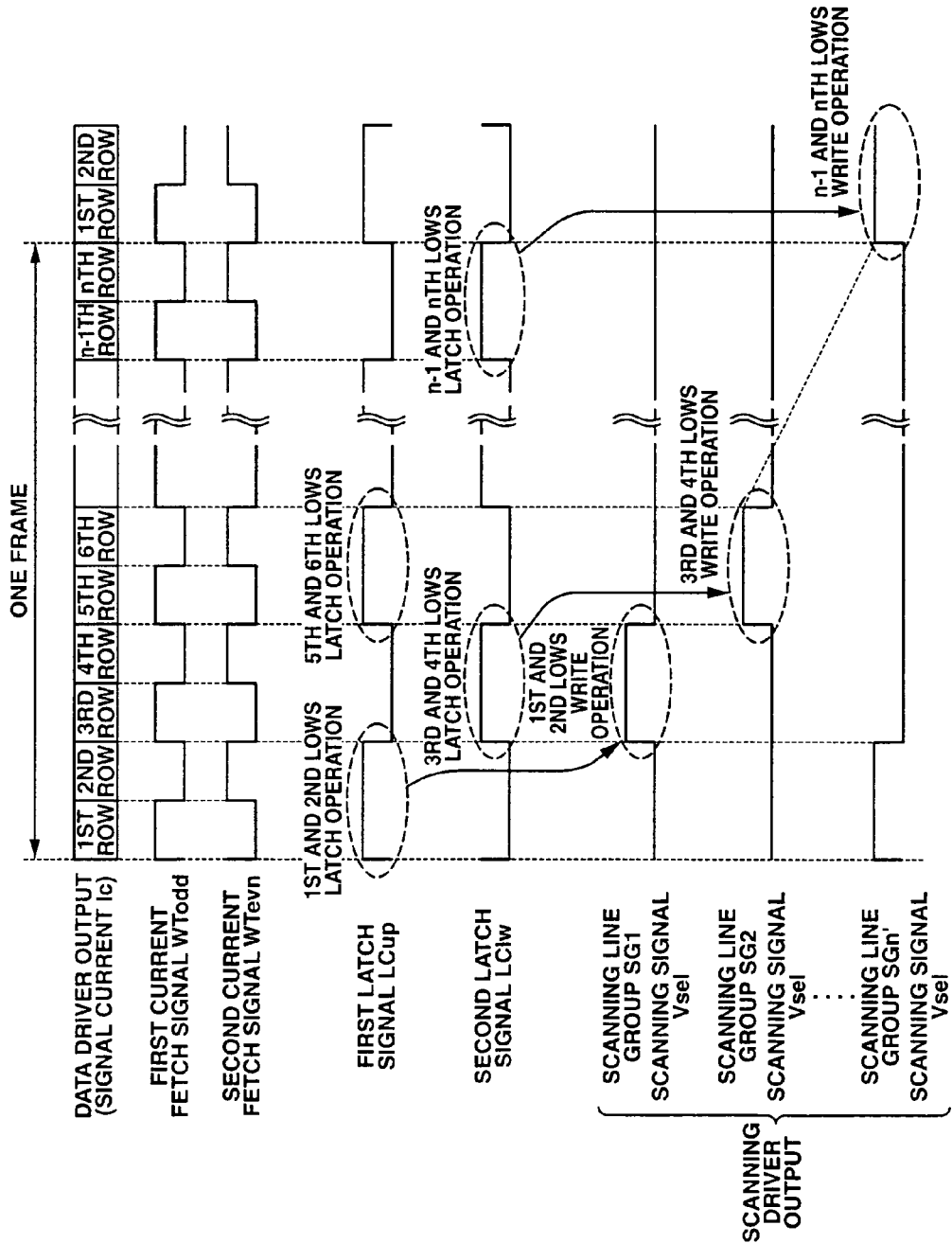
FIG. 6 is a timing chart illustrating a drive control operation (a drive control method) in the display apparatus according to the embodiment depicted in FIG. 1.

FIG. 6 is a timing chart illustrating a drive control operation (a drive control method) in the display apparatus according to this embodiment.

In this example, the description will be given with reference to each structure of the display apparatus described above.

In the display apparatus having the above-described structure, display data consisting of digital data which allows each display pixel (a light emitting element) EM constituting the display panel 110A to emit a light with a predetermined luminance gradation is first extracted from a video signal by using the display signal generating section 160, and the extracted display data is sequentially supplied to the current generating section 130 as serial data corresponding to each row of the display panel 110A.

The display data (the digital data) supplied to the current generating section 130 is converted into a signal current (a gradation signal) Ic corresponding to the display data at a timing based on a data control signal fed from the system controller 150, and output to the current holding/distributing section 140A provided in accordance with the data line group DGj of each column arranged in the display panel 110A.

In this example, the signal current Ic output from the current generating section 130 is output in time series in units of the data line group DGj corresponding to each column in the display panel 110A in accordance with each row for the respective display pixels EM connected to the respective data lines DLja and DLjb constituting the data line group DGj, for example.

As shown in FIG. 6, the current distributing operation is executed in the current holding/distributing section 140A. In the current distributing operation, the signal current Ic corresponding to the display pixels EM arranged in the plurality of rows (two rows in this embodiment) in accordance with each column is sequentially fetched, the transistors or switches Tr41a and Tr41b of the current distribution circuit 141 are selectively turned on at the timing based on data control signals (first and second current fetch signals WTodd and WTevn) supplied from the system controller 150, and the signal current Ic is sequentially supplied to the latch section 142a (or 142c) and the latch section 142b (or 142d) of the current holding circuit 142.

Then, in synchronization with this timing, the latch sections 142a and 142b of the current holding circuit 142 are set in the current holding operation state based on the data control signals (the first latch signal LCup at the high level and the second latch signal LClw at the low level) supplied from the system controller 150. As a result, only in a period that the signal current Ic is supplied to the respective latch sections 142a and 142b, the current holding operation is sequentially executed. In the current holding operation, the electric charges based on the signal current Ic corresponding to the display pixels EM in the respective rows (e.g., the first row and the second row) is stored in the respective storage capacitances Ca and Cb.

As shown in FIG. 6, such a current distributing operation and current holding operation are alternately repeated in the latch sections 142a and 142b and the latch sections 142c and 142d with the signal levels of the first and second current fetch signals WTodd and WTevn and the first and second latch signals LCup and LClw being appropriately set. Consequently, the signal current Ic corresponding to the display pixels EM in the two rows based on the display data is sequentially held in each current holding circuit 142.

Subsequently, after the current holding operation, the latch sections 142a and 142b of the current holding circuit 142 are set in the current output operation state based on the data control signals (the first latch signal LCup at the low level and the second latch signal LClw at the high level) supplied from the system controller 150. As a result, the current output operation is executed in the respective latch sections 142a and 142b. In the current output operation, the gradation current Ipix based on the electric charges stored in the respective storage capacitances Ca and Cb is simultaneously supplied to the display pixels EM in the respective rows (e.g., the first row and the second row) through the respective data lines DLja and DLjb constituting the data line group DGj.

Therefore, the gradation current Ipix is output from the current holding/distributing section 140A through the data line group DGj of each column, and the scanning signal Vsel at the high level is applied to a specific scanning line group SGi from the scanning driver 120A at the timing based on the scanning control signal supplied from the system controller 150. As a result, all the selection transistors Trsel connected to the respective scanning lines SLia and SLib constituting this scanning line group SGi are turned on, the gradation current Ipix supplied to the display pixels EM in the plurality of rows (e.g., two rows including the first row and the second row) through the data lines DLja and DLjb of each data line group DGj is written in the respective display pixels EM, thereby executing the light emission operation with a predetermined luminance gradation based on the gradation current Ipix.

Furthermore, in the respective latch sections 142a and 142b, in a period where the current output operation is executed, as shown in FIG. 6, the latch sections 142c and 142d of the current holding circuit 142 are set in the current holding operation state based on the data control signals (the first latch signal LCup at the low level and the second latch signal LClw at the high level) supplied from the system controller 150. As a result, the current holding operation is sequentially executed. In this operation, the signal current Ic for each row continuously supplied from the current generating section 130 is fetched in the respective latch sections 142c and 142d, and the electric charges based on the signal current Ic corresponding to the display pixels EM in the respective rows (e.g., the third row and the fourth row) are stored in the respective storage capacitances Cc and Cd.

Then, after the current output operation in the latch sections 142a and 142b, the system controller 150 again sets the first latch signal LCup to the high level and the second latch signal LClw to the low level. As a result, the latch sections 142a and 142b are again set in the current holding operation state. Consequently, the current output operation is executed in the respective latch sections 142a and 142b. In the current output operation, the electric charges based on the signal current Ic corresponding to the display pixels EM in the respective rows (e.g., the fifth row and the sixth row) are stored in the respective capacitances Ca and Cb.

Moreover, at this time, when the latch sections 142c and 142d of the current holding circuit 142 are set in the current output operation state, there is executed the current output operation in which the gradation current Ipix based on the electric charges stored in the respective storage capacitances Cc and Cd at the foregoing timing is simultaneously supplied to the display pixels EM in respective rows (e.g., the third row and the fourth row) through the respective data lines DLja and DLjb constituting the data line group DGj.

As a result, in the latch sections 142a and 142b and the latch sections 142c and 142d on the two stages constituting the respective current holding circuits 142 provided in accordance with respective columns in the current holding/distributing section 140A, the controls of simultaneously executing the current holding operation and the current output operation are alternately repeated in accordance with a predetermined operation cycle. Consequently, there is executed the operation in which the signal current Ic corresponding to the display data of each row output from the current generating section 130 is continuously fetched and held in the current holding circuit and simultaneously supplied to the display pixels in the plurality of rows as the gradation current Ipix.

Therefore, this embodiment is configured in such a manner that the display pixels in a plurality of rows (two rows in this embodiment) are altogether set in the selected state by applying a single scanning signal from the scanning driver to the display panel in which the plurality of display pixels are two-dimensionally arranged and that display data corresponding to the display pixels in the plurality of rows is sequentially fetched and held by the signal driver and the gradation current corresponding to the plurality of rows is simultaneously supplied to the respective display pixels at a predetermined timing (e.g., one scanning period). Therefore, as compared with a known drive control method which applies one scanning signal to one scanning line, the number of scanning lines driven at a single scanning timing (the number of rows of the display pixels to be selected) becomes severalfold, and a time required to write the gradation current in the display pixels can be set to be substantially severalfold (twofold in this embodiment).

Additionally, since the data lines arranged in each column are formed as a data line group in which a plurality of (two in this embodiment) data lines are determined as one set, a capacitance component consisting of a holding capacitance which is parasitic to each data line and provided in each display pixel or a parasitic capacitance of a drive transistor can be greatly reduced (½ in this embodiment) as compared with a configuration of a known display apparatus in which one data line is arranged in one column. Therefore, a time required to write the gradation current supplied to each data line in each display pixel can be reduced, or a delay of this write time can be suppressed.

As a result, a sufficiently long time to write display data in each display pixel can be assured. Therefore, when the display panel is increased in size or the high definition is realized, or even when an image is displayed with a low gradation, the wiring capacitance of the data lines can be satisfactorily charged to a predetermined voltage, thereby eliminating the insufficient write state of display data. Further, each display pixel can be allowed to emit a light with an appropriate luminance gradation corresponding to display data, and a luminance gradient (display, irregularities) generated in the display panel can be greatly reduced, thereby improving the display image quality.

The present invention is configured in such a manner that the scanning lines arranged in the respective rows are formed of the scanning line group in which a plurality of (two in this embodiment) scanning lines are determined as one set and that the display pixels for a plurality of rows (two rows in this embodiment) are altogether set in the selected state by using a single scanning signal. Therefore, the number of scanning signals output from the scanning driver to the display panel can be greatly reduced (½ in this embodiment), and the number of the connection terminals between the display panel and the scanning driver can be largely decreased (½ in this embodiment). As a result, even if the high definition is realized in the display panel, an increase in number of the output terminals of a driver chip can be suppressed, and a pitch (a gap) between the terminals can be prevented from being small, thereby simplifying the positional accuracy in a connection step of the driver chip or reducing the number of steps.

Furthermore, when a field effect thin film transistor in which an amorphous silicon layer or a polysilicon layer is a channel layer is applied as each transistor constituting the current holding/distributing section, the current holding/distributing section can be integrally formed with the display panel (the pixel array) on the same substrate, and an increase in the number of components can be suppressed, thereby keeping a product cost of the display apparatus down.

The above has described the example in which the scanning line group is arranged to correspond to the display pixels in, e.g., two rows and the data line group corresponding to the display pixels in the two rows is arranged so that the display pixels in the two rows can be simultaneously set in the selected state by using a single scanning signal as the first embodiment of the display apparatus according to this embodiment. However, the present invention is not restricted thereto. Another structural example of the display apparatus according to this embodiment will now be described.

Figure 7:
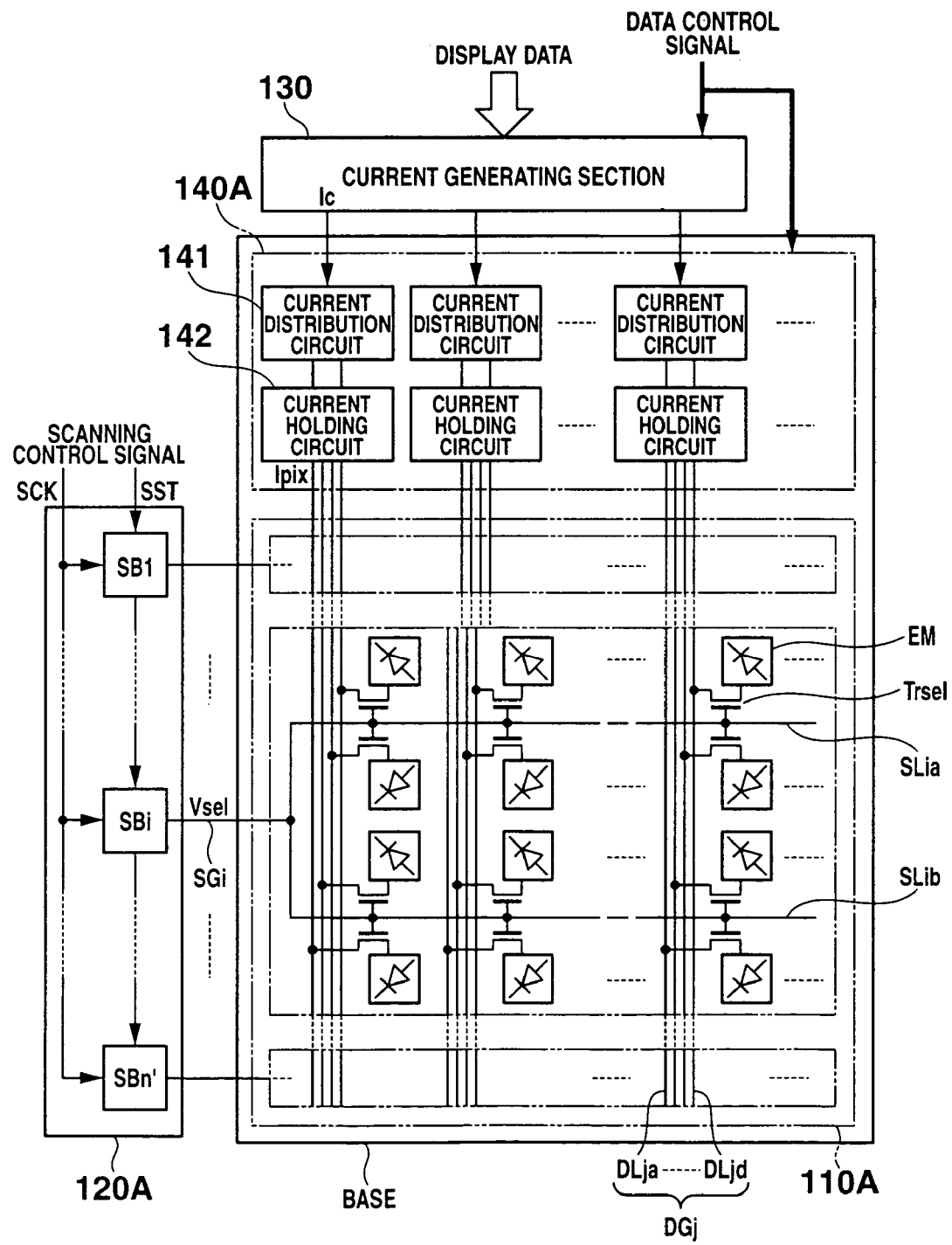
FIG. 7 is a schematic structural view showing a primary part of another structural example of the display apparatus according to the embodiment depicted in FIG. 1.

FIG. 7 is a schematic structural view showing a primary part of still another structural example of the display apparatus according to this embodiment.

Figure 8:
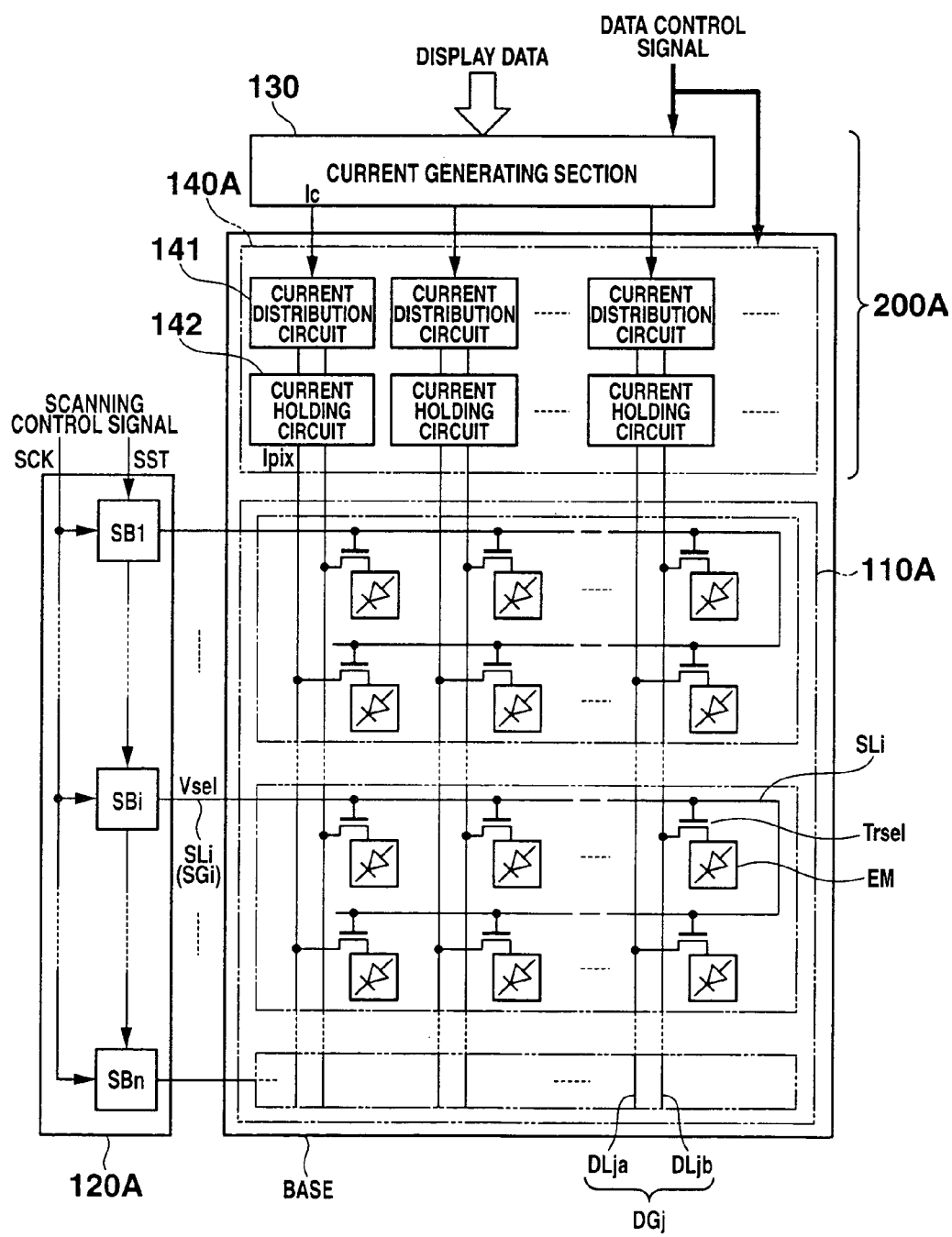
FIG. 8 is a schematic structural view showing a primary part of still another example of the display apparatus according to the embodiment depicted in FIG. 1.

FIG. 8 is a schematic structural view showing a primary part of yet another structural example of the display apparatus according to this embodiment.

That is, for example, as shown in FIG. 7, the display panel 110A may be configured to have each scanning line group SGi arranged to correspond to two or more rows (four rows) and each data line group DGj which comprises a plurality of (four) data lines DLja to DLjd whose number (four) corresponds to the plurality of rows and is arranged in accordance with each pixel row. Display pixels EM in the plurality of rows (four rows) can be simultaneously set in the selected state by using a single scanning signal Vsel.

Furthermore, as shown in FIG. 8, as a configuration (a layout format of scanning lines) of a scanning line group arranged to correspond to a plurality of rows, for example, one scanning line SLi may be drawn (turned) within the display panel 110A without divergence and connected to the display pixels EM in a plurality of rows (two rows) in common.

Second Embodiment of Display Apparatus

A second embodiment of a display apparatus according to the present invention will now be described with reference to the accompanying drawings.

Figure 9:
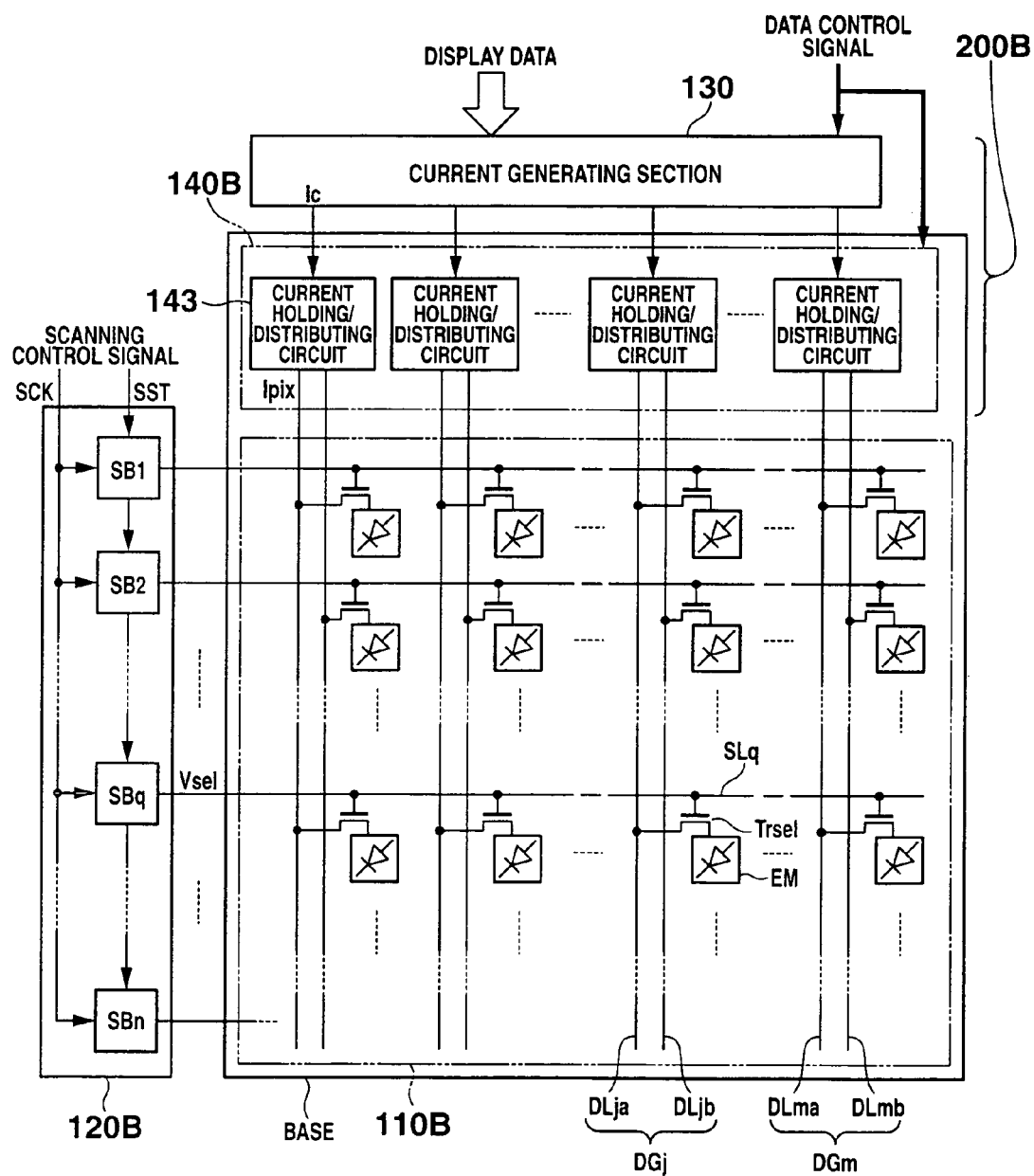
FIG. 9 is a structural view showing a part of a second embodiment of a display apparatus according to the present invention.

FIG. 9 is a structural view showing a primary part of a second embodiment of a display apparatus according to the present invention.

Here, structures equal to those in the first embodiment are denoted by equal or like reference numerals, thereby eliminating the explanation thereof.

The display apparatus according to the abovementioned first embodiment comprises: the display panel in which each scanning line group SGi corresponding to a plurality of rows and each data line group DGj consisting of a plurality of data lines corresponding to the plurality of rows are arranged; and peripheral circuits (the scanning driver and the signal driver comprising the current generating section and the current holding/distributing section) corresponding to the display panel. The display apparatus according to the second embodiment comprises: a display panel in which each scanning line provided in accordance with each row and each data line group consisting of a plurality of data lines corresponding to a plurality of rows are arranged; and peripheral circuits (a scanning driver and a signal driver comprising a current generating section and a current holding/distributing section) corresponding to the display panel.

As shown in FIG. 9, a display panel 110B according to this embodiment generally comprises: a plurality of display pixels EM which are two-dimensionally arranged (n rows×m columns) and connected to each other through selection transistors Trsel; a plurality of scanning lines SLq (q is a positive integer falling within a range of $1 \leq q \leq n$; n is a positive integer and the total number of pixel rows set in the display panel 110) arranged in accordance with the display pixels EM in respective rows; and a plurality of data line groups DGj which are arranged in accordance with the display pixels EM in respective columns and in which a plurality of (two in this embodiment) data lines DLja and DLjb (j is a positive integer falling within a range of $1 \leq j \leq m$; m is a positive integer and the total number of pixel columns set in the display panel 110) are determined as one set. Each display pixel EM is provided at each intersection of the scanning line SLq and the data lines DLja and DLjb constituting each data line group DGj.

The scanning driver (the selection circuit) 120B is generally connected with the scanning lines SLq in the display panel 110B, and sequentially applies a scanning signal Vsel to each scanning line SLq at a predetermined timing to sequentially set the display pixels EM in each row (one row) connected with the scanning line SLi in a selected state.

The current generating section 130 generally generates a signal current (a gradation signal) Ic having a current value corresponding to a luminance gradation value based on display data in accordance with the display data supplied from the display signal generating section 160.

The current holding/distributing section 140B is generally connected with each data line group DGj in the display panel 110B. The section 140B fetches the signal current Ic corresponding to a plurality of rows (two rows in this embodiment) supplied from the current generating section 130 in time series, and sequentially supplies a gradation current Ipix based on the signal current Ic to the display pixels EM in a plurality of rows (two rows in this embodiment) at a predetermined timing. In this embodiment, the current generating section 130 and the current holding/distributing section 140B constitute a signal driver 200B.

It is to be noted that, in the configuration shown in FIG. 9, the current holding/distributing section 140B is integrally formed with a pixel array on an insulating substrate BASE on which the plurality of display pixels EM (i.e., the pixel array) constituting the display panel 110B are formed as a structural example, but the present invention is not restricted thereto.

For example, the signal driver 200B may have a conformation of a driver chip and mounted (packaged) on the substrate BASE. The detail will be described later.

A concrete configuration of each structure will now be described.

(Display Panel)

For example, as shown in FIG. 9, the display panel 110 which can be applied to the display apparatus according to this embodiment has a configuration in which each scanning line SLq corresponding to each pixel row and each data line group DGj having two data lines DLja and DLjb determined as one set and corresponding to one pixel column are arranged to be orthogonal to each other and the display pixel EM is connected at each intersection of an odd-numbered scanning line SLi and the data line DLja in each column and at each intersection of an even-numbered scanning line SLi and the data line DLjb in each column.

In this embodiment, in the configuration depicted in FIG. 9, although the data line group DGj arranged in each column is configured with the two data lines DLja and DLjb being determined as one set, the present invention is not restricted thereto, and two or more data lines may be determined as one set. In this case, when the number of data lines constituting the data line group DGj is q (i.e., the number of the data lines DLj1 to DLjq is q), there is provided a configuration in which the display pixel EM is connected at each intersection of the scanning line in each row which can be calculated by dividing a line number by q with a remainder of 1 (each scanning line in the first, q+1th, 2q+1th, . . . rows) and the first data line DLj1 in each column, the display pixel EM is connected at each intersection of the scanning line in each row which can be calculated in the same manner with a remainder of 2 (each scanning line in the second, q+2th, 2q+2th, . . . rows) and the second data line DLj2 in each column, the display pixel and the data line are then connected in the same relationship, and the display pixel EM is connected at each intersection of the scanning line in each row which can be calculated in the same manner with a remainder of 0 (each scanning line in the qth, 2qth, 3qth, . . . rows) and the qth (last) data line DLjq in each column.

Further, like the display pixel EM in FIG. 2, each display pixel EM generally has a configuration in which a gate terminal is connected with each scanning line SLi and a source terminal is connected with a drain terminal of the selection transistor Trsel connected to each data line DLja or DLjb, and comprises a current controlled type light emitting element which emits a light with a predetermined luminance gradation based on a gradation current Ipix supplied through the selection transistor Trsel.

In the display panel 110B having such a configuration, by applying a scanning signal Vsel to the scanning line SLi in a specific row from the later-described scanning driver 120B, the selection transistor Trsel connected with this scanning line SLi is turned on, and the display pixels EM in this row are altogether set in a selected state. In this selected state, when the gradation current Ipix corresponding to display data is simultaneously supplied to a specific data line in each data line group DGj, the display data is simultaneously written in the display pixels EM in this row set in the selected state through the selection transistors Trsel which has been turned on.

(Scanning Driver)

The scanning driver 120B sequentially executes an operation of applying the scanning signal Vsel at a selection level (e.g., a high level) to each scanning line SLq based on a scanning control signal supplied from the system controller 150 so that the display pixels EM in each row connected with each scanning line SLi are simultaneously set in the selected state and the display pixels EM in at least adjacent rows are simultaneously set in the selected state in a predetermined period. That is, as shown in, e.g., FIG. 9, the scanning driver 120 comprises shift blocks SB1, SB2, . . . , SBi, . . . SBn each comprising a shift register and a buffer on a plurality of stages (n stages in this embodiment) in accordance with respective scanning lines SLq. A shift signal which is output while sequentially shifting from the upper part toward the lower part in the display panel 110 by the shift registers is applied to each scanning line SLq through each buffer as a scanning signal Vsel having a predetermined selection level (a high level) based on scanning control signals (a scanning start signal SST, a scanning clock signal SCK and the like) supplied from the system controller 150. Here, in this embodiment, in the scanning driver having the above-described configuration, for example, a scanning clock signal SCK is set to a regular time width which sets the selected state (a selection time width for each row in which the scanning signal Vsel is applied) in a predetermined period (one horizontal scanning period) in accordance with each row and a scanning start signal SST is set to a selection time width for two rows (two horizontal scanning periods). As a result, the shift signal having the time width for two rows is shifted between the respective shift blocks SB1, SB2, . . . SBi, . . . SBn, and the scanning signal Vsel based on the shift signal is applied to at least adjacent scanning lines SLi in an overlapping manner in a predetermined period.

(Current Generating Section)

The current generating section 130 has the same configuration as that of the current generating section 130 in the first embodiment shown in FIG. 3, and sequentially and repeatedly executes an operation for one screen. In this operation, the current generating section 130 sequentially fetches at a predetermined timing display data corresponding to the display pixels in a plurality of rows (two rows in this embodiment) in each data line group DGj supplied from the display signal generating section 160 based on a data control signal fed from the system controller 150, generates a signal current (a gradation signal) Ic having a current value corresponding to a luminance gradation value of the display data, and sequentially supplies the signal current Ic for a plurality of rows to the current holding/distributing section 140B in time series in accordance with each column.

(Current Holding/Distributing Section)

The current holding/distributing section 140B sequentially fetches and holds at a predetermined timing the signal current Ic for the plurality of rows corresponding to each data line group DGj supplied from the current generating section 130 in time series based on the data control signal fed from the system controller 150. The section 140B simultaneously supplies the signal current Ic as a gradation current Ipix to the display pixels EM in each row which are set in the selected state through each data line group DGj.

Specifically, for example, as shown in FIG. 9, the current holding/distributing section 140B comprises at least a plurality of current holding/distributing circuits 143 provided in accordance with the respective data line groups DGj arranged in the display panel 110B. Moreover, the current holding/distributing section 140B distributes and holds the signal current Ic supplied in time series from the current generating section 130 in accordance with each of the plurality of (two in this embodiment) data lines DLja and DLjb in each data line group DGj at a timing of setting each scanning line SLq in the selected state, and sequentially supplies the gradation current Ipix based on the held signal current Ic to the display pixels EM of the respective data lines DLja and DLjb.

It is to be noted that the concrete configuration and operation of the current holding/distributing section 140B will be described later in detail.

<Concrete Example of Current Holding/Distributing Section>

A concrete example of the current holding/distributing section which can be applied to the display apparatus according to this embodiment will now be described.

Figure 10:
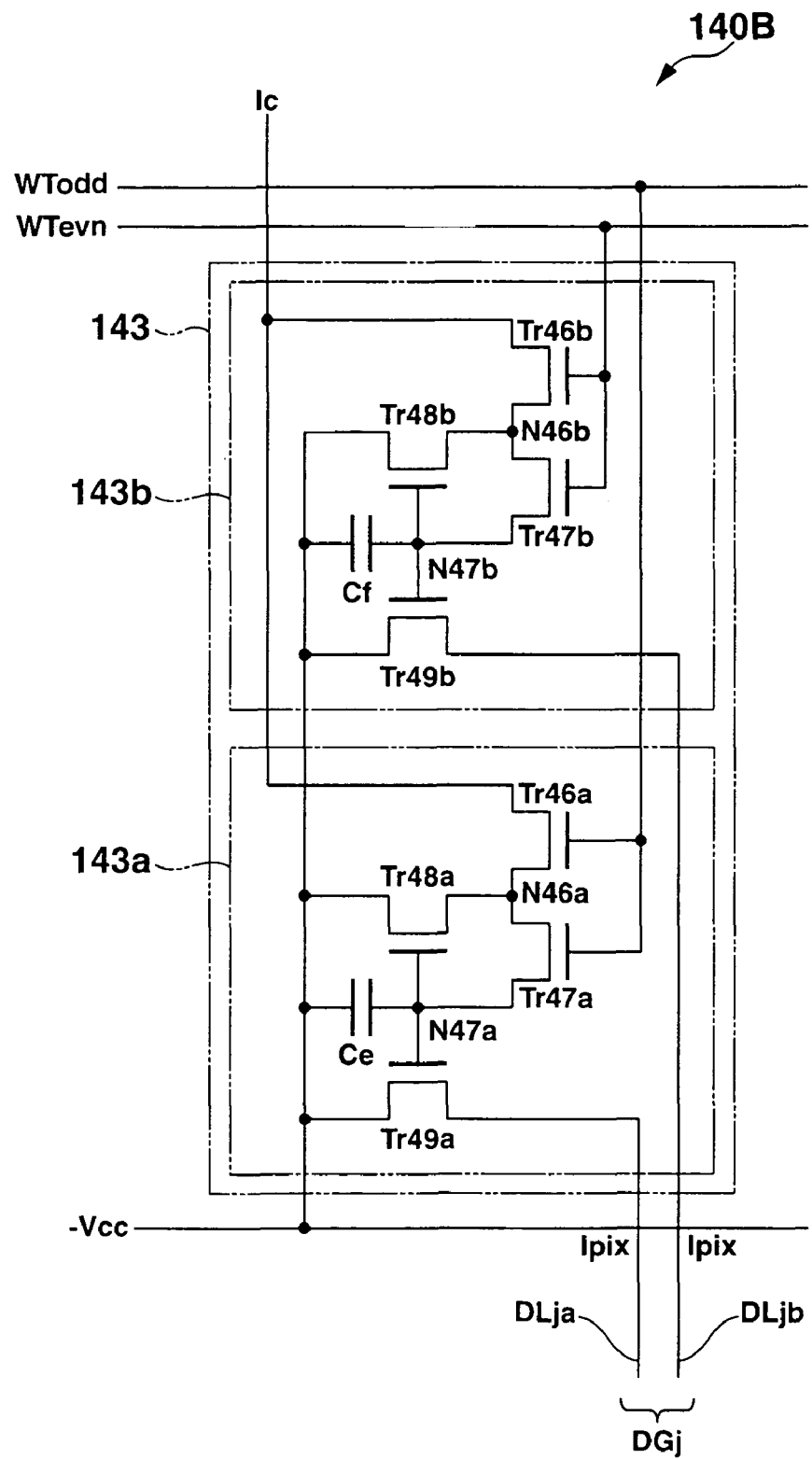
FIG. 10 is a circuit block diagram showing a structural example of a current holding/distributing section which can be applied to the display apparatus according to the embodiment depicted in FIG. 9.

FIG. 10 is a circuit block diagram showing a structural example of the current holding/distributing section which can be applied to the display apparatus according to this embodiment.

It is to be noted that just a structural example which can be applied to the display apparatus according to this embodiment is described herein, and the present invention is not restricted to this example.

Each current holding/distributing circuit 143 constituting the current holding/holding section 140B is, as shown in, e.g., FIG. 10, configured to have a two-stage latch section comprising a holding section (a signal holding/outputting section) 143a connected with the data line DLja and a latch section (the signal holding/outputting section) 143b connected with the data line DLjb, these sections 143a and 143b being connected in parallel with the signal current Ic output from the current generating section 130 being supplied thereto in common. The data lines Dlja and DLjb constitutes each data line group DGj.

For example, as shown in FIG. 10, the current holding/distributing section 143a includes a transistor Tr46a in which the signal current Ic output from the current generating section 130 is supplied to one end side of a current path (a source or a drain), the other end side of the same is connected with a contact point N46a and a first current fetch signal WTodd is applied to a control terminal (a gate); a transistor Tr47a in which a current path is connected between the contact point N46a and a contact point N47a and the first current fetch signal WTodd is applied to a control terminal; a transistor Tr48a in which one end side of a current path is connected with the contact point N46a, the other end side of the same is connected with a low-potential voltage (−Vcc) and a control terminal is connected with the contact point N47a; a transistor Tr49a in which one end side of a current path is connected with the low-potential voltage (−Vcc), the other end side of the same is connected with the data line DLja and a control terminal is connected with the contact point N47a; and a storage capacitance Ce connected between the contact point N47a and the low-potential voltage (−Vcc).

Furthermore, the current holding/distributing section 143b also includes, as shown in, e.g., FIG. 10, a transistor Tr46b in which a signal current Ic output from the current generating section 130 is supplied to one end side of a current path (a source or a drain), the other end side of the same is connected with a contact point N46b and a second current fetch signal WTevn is applied to a control terminal (a gate); a transistor Tr47b in which a current path is connected between the contact point N46b and a contact point N47b and the second current fetch signal WTevn is applied to a control terminal; a transistor Tr48b in which one end side of a current path is connected with the contact point N46b, the other end side of the same is connected with a low-potential voltage (−Vcc) and a control terminal is connected with the contact point N47b; a transistor Tr49b in which one end side of a current path is connected with the low-potential voltage (−Vcc), the other end side of the same is connected with the data line DLjb and a control terminal is connected with the contact point N47b; and a storage capacitance Cf connected between the contact point N47b and the low-potential voltage (−Vcc).

Here, in the current holding/distributing section 140B according to this embodiment, for example, an n-channel type field effect thin film transistor in which an amorphous silicon layer is a channel layer or a field effect thin film transistor in which a polysilicon layer is a channel layer may be applied as each of the transistors Tr46a to Tr49a and Tr46b to Tr49b. In this case, as shown in FIG. 9, the current holding/distributing section 140B can be integrally formed with the pixel array on the insulating substrate BASE constituting the display panel 110B.

Additionally, each of the storage capacitances Ce and Ce provided to the respective latch sections 142a and 143b may be a parasitic capacitance formed between the gate and the source of each of the transistors Tr49a and 49b or an individually provided capacitance element.

In the current holding/distributing circuit 143, the storage capacitances Ce and Cf constitute the signal holding section and the charges storage circuit according to the present invention, the transistors Tr46a, Tr47a, Tr46b and Tr47b constitute the signal distributing section according to the present invention, and the transistors Tr48a, Tr49a, Tr48b and Tr49b constitute the gradation current outputting section according to the present invention.

The invention in the current holding/distributing section having the above-described configuration will now be explained.

FIGS. 11A and 11B are conceptual views illustrating general operations of the current holding/distributing section which can be applied to this embodiment.

The operation of the current holding/distributing section 140B (the current holding/distributing circuit 143) according to this embodiment has: a current holding/output operation of sequentially fetching the signal current Ic based on display data corresponding to the display pixels in two rows supplied from the current generating section in time series by the respective latch sections 143a and 143b of the current holding/distributing circuit 143, generating a gradation current Ipix based on the signal current (a gradation signal) Ic and individually outputting the generated current to the respective data lines Dlja and DLjb constituting the data line group DGj at a predetermined timing; and a current output holding operation of continuing output of the gradation current Ipix in the current holding/output operation for a predetermined period. The current holding/distributing section 140B is controlled to alternately repeat the current holding/output operation and the current output holding operation with partially overlapping periods between the latch sections 143a and 143b connected in parallel. As a result, output periods of the gradation current Ipix from the respective latch sections 143a and 143b in the current holding/output operation are set to partially overlap.

The operation will now be concretely described with reference to each circuit configuration in the current holding/distributing section.

In the current holding/distributing circuit 143 (the latch sections 143a and 143b), the first and second current fetch signals WTodd and WTevn supplied as data control signals from the system controller 150 are selectively set to a high level. As a result, one (the latch section 143a or 143b) of the latch sections 143a and 143b is set in the current holding/output operation state in which the signal current Ic is fetched and the gradation current Ipix corresponding to the signal current Ic is output, and the other latch section (the latch section 143b or 143a) is set in the current output holding operation state in which the output state of the gradation current Ipix in the current holding/output operation state with the foregoing timing is continued.

Specifically, in the current holding/output operation, as shown in FIG. 11A, the first current fetch signal WTodd is set to the high level, and the second current fetch signal WTevn is set to the low level. As a result, in the latch section 143a, the transistors Tr46a and Tr47a are turned on, the part between the gate and the drain of the transistor Tr48a is electrically short-circuited by the transistor Tr47a and hence the transistor Tr48a is turned on in a saturation region. As a result, the signal current (the gradation signal) Ic supplied from the current generating section 130 flows toward the low-potential voltage (−Vcc) side through the transistors Tr46a and Tr48a of the latch section 143a, and a current level of the signal current Ic is converted into a voltage level between the gate and the source of the transistor Tr48a so that the signal current Ic is stored as the electric charges in the storage capacitance Ce.

At this time, with storage of the electric charges in the storage capacitance Ce, the transistors Tr48a and Tr49a constituting a current mirror circuit are turned on by an increase in potential at the contact point N47a, and the gradation current Ipix having a predetermined current ratio set in the current mirror circuit with respect to the signal current Ic flows in such a manner that the gradation current Ipix is drawn from the data line DLja side toward the low-potential voltage (−Vcc) direction (i.e., from the display pixel EM side toward the latch section 143a) through the transistor Tr49a.

In the current output holding operation, as shown in FIG. 11B, the first current fetch signal WTodd is set to the low level, and the second current fetch signal WTevn is set to the high level. As a result, in the latch section 143a, the transistors Tr46a and Tr47a are turned off. At this time, since a potential (a high voltage) based on the electric charges (the signal current Ic) stored in the storage capacitance Ca is held in the contact point N47a by the current holding/output operation, the transistor Tr49a continues the ON state. Consequently, the operation state in which the gradation current Ipix is drawn from the data line DLja side toward the latch section 143a (the current holding/distributing circuit 143) is held.

Further, in the state where the first current fetch signal WTodd is set at the low level and the second current fetch signal WTevn is set at the high level (i.e., the current output holding operation state of the latch section 143a mentioned above), the transistors Tr46b and Tr47b are turned on, and the part between the gate and the drain of the transistor Tr48b is electrically short-circuited by the transistor Tr47b so that the transistor Tr48b is turned on a saturation region in the latch section 143b connected with the latch section 143a in parallel. Therefore, the current holding/output operation is executed. In this operation, the signal current Ic flows toward the low-potential voltage (−Vcc) side through the transistors Tr46b and Tr48b of the latch section 143b, and a current level of the signal current Ic is converted into a voltage level between the gate and the source of the transistor Tr48b so that the signal current Ic is stored as the electric charges in the storage capacitance Cf. Further, the transistors Tr48b and Tr49b constituting the current mirror circuit are turned on with an increase in potential at the contact point N47b, and the gradation current Ipix having a predetermined current ratio with respect to the signal current Ic flows in such a manner that the gradation current Ipix is drawn from the data line DLjb side toward the low-potential voltage (−Vcc) side (i.e., from the display pixel EM side toward the latch section 143b) through the transistor Tr49b.

That is, in a period where one of the latch sections 143a and 143b is set in the current holding/output operation state, the other section is concurrently set in the current output holding operation state.

It is to be noted that the description has been given as to the example where the negative gradation current Ipix corresponding to the signal current Ic having the positive polarity supplied from the current generating section 130 is generated and the gradation current Ipix is drawn from the data line (the display pixel) side in the current holding/distributing section 140B in order to cope with the circuit configuration of the later-described pixel drive circuit provided in the display pixel EM. However, the current holding/distributing section 140B may have a configuration in which the gradation current Ipix with the positive polarity is generated and passed to the data lines (the display pixels) in accordance with the circuit configuration of the display pixels EM.

<Drive Control Method of Display Apparatus>

A drive control operation in the display apparatus having the above-described configuration will now be explained.

Figure 12:
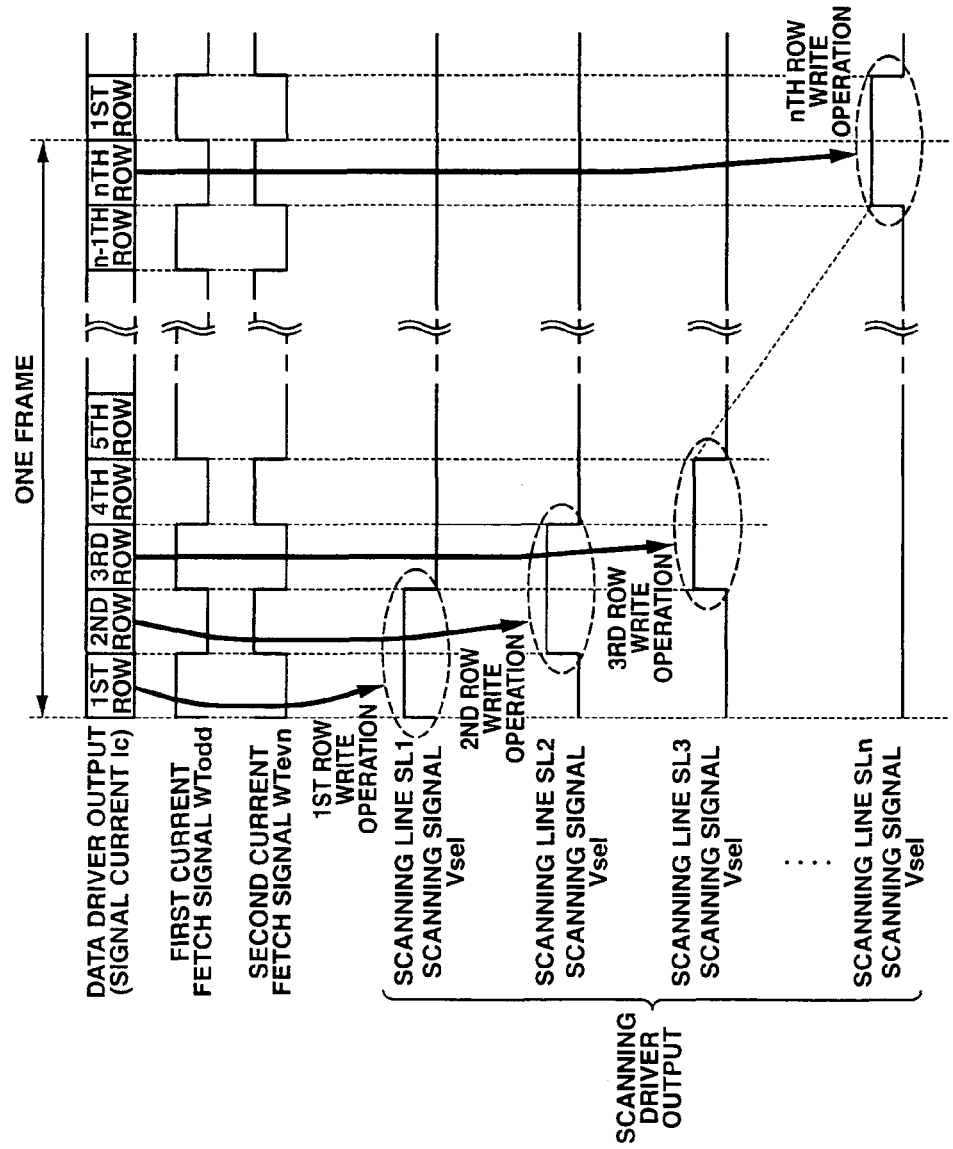
FIG. 12 is a timing chart showing a drive control method of the display apparatus according to the embodiment depicted in FIG. 9.

FIG. 12 is a timing chart showing a drive control method of the display apparatus according to this embodiment.

In the display apparatus having the above-described configuration, display data consisting of digital data is first extracted from a video signal by the display signal generating section 160, the display data being used to allow each display pixel (a light emitting element) EM constituting the display panel 110B with a predetermined luminance gradation, the extracted display data is then sequentially supplied to the current generating section 130 as serial data corresponding to each row of the display panel 110B.

The display data supplied to the current generating section 130 is converted into a signal current (a gradation signal) corresponding to the display data at a timing based on a data control signal fed from the system controller 150, and output to the current holding/distributing section 140B provided in accordance with the data line group DGj of each column arranged in the display panel 110B.

In the current holding/distributing section 140B, as shown in FIG. 12, the latch section 143a of the current holding/distributing circuit 143 is set in the current holding/outputting operation state based on data control signals (a first current fetch signal WTodd at the high level and a second current fetch signal WTevn at the low level) supplied from the system controller 150. As a result, the current holding/outputting operation is executed. In this operation, the signal current Ic corresponding to the display pixels EM for one row (e.g., the first row) in each column is fetched, and the electric charges based on the signal current Ic is stored in the storage capacitance Ce. At the same time, a gradation current Ipix having a predetermined current value is generated based on the electric charges stored in the storage capacitance Ce and a current ratio set by a current mirror circuit (the transistors Tr48a and Tr49a), and the generated gradation current Ipix is supplied to each display pixel EM in this row (the first row) through each data line DLja.

Subsequently, after the current holding/outputting operation, the latch section 143a of the current holding/distributing circuit 143 is set in the current output holding operation state based on data control signals (the first current fetch signal WTodd at the low level and the second current fetch signal WTevn at the high level) supplied from the system controller 150. As a result, the current output holding operation is executed. In this operation, the gradation current Ipix based on the electric charges (i.e., the signal current Ic) stored in the storage capacitance Ce is continuously supplied to each display pixel EM in this row (the first row) through each data line DLja in the latch section 143a.

On the other hand, as shown in FIG. 12, in the latch section 143a, in a period where the current output holding operation is executed, the latch section 143b of the current holding/ distributing circuit 143 is set in the current holding/outputting operation based on data control signals (the first current fetch signal WTodd at the low level and the second current fetch signal WTevn at the high level) supplied from the system controller 150. As a result, the current holding/outputting operation is executed. In this operation, the signal current Ic for the next row (e.g., the second row) continuously supplied from the current generating section 130 is fetched in the latch section 143b, and the electric charges is stored in the storage capacitance Cf. At the same time, a gradation current Ipix having a predetermined current value is generated based on the electric charges stored in the storage capacitance Cf and a current ratio set by the current mirror circuit (the transistors Tr48b and Tr49b), and the generated gradation current Ipix is then supplied to each display pixel EM in this row (the second row).

Then, after the current output holding operation in the latch section 143a, the system controller 150 again sets the first current fetch signal WTodd to the high level and the second current fetch signal WTevn to the low level. As a result, the latch section 143a is again set in the current holding/outputting operation state. Consequently, the current holding/outputting operation is executed. In this operation, the electric charges based on the signal current Ic for the next row (e.g., the third row) is stored in the storage capacitance Ce. At the same time, the gradation current Ipix based on the electric charges stored in the storage capacitance Ce and the current ratio set by the current mirror circuit is supplied to each display pixel EM in this row (the third row) through each data line DLja.

Furthermore, at this time, when the latch section 142b of the current holding/distributing section 143 is set in the current output holding operation state, the current output holding operation is executed. In this operation, the gradation current Ipix based on the electric charges stored in the storage capacitance Cf at the foregoing timing is supplied to each display pixel EM in a row which is a target of the current holding/outputting operation (the second row) through each data line DLjb.

As a result, in the current holding/distributing section 140B, the controls which concurrently execute the current holding/outputting operation and the current output holding operation are alternately repeated with predetermined operation cycles between the latch sections 143a and 143b on the two stages constituting each current holding/distributing circuit 143 provided in accordance with each column. As a result, there is executed the operation in which the signal current Ic corresponding to the display data of each row sequentially supplied from the current generating section 130 is continuously fetched and held in the current holding circuit and, at the same time, the signal current Ic is simultaneously supplied to the display pixels in each row as the gradation current Ipix.

Therefore, the gradation current Ipix is output from the current holding/distributing section 140B through the data line group DLj of each column, and the scanning signal Vsel at the high level is applied from the scanning driver 120 to at least adjacent scanning lines SLq at the timing based on the scanning control signal supplied from the system controller 150 in an overlapping manner during a predetermined period. As a result, the gradation current Ipix sequentially supplied through the data lines DLja and DLjb of each data line group DLj is written in the display pixels EM in a plurality of rows (e.g., two rows including the first row and the second row) corresponding to the respective scanning lines SLi, and a light emission operation is executed with a predetermined luminance gradation based on the gradation current Ipix.

As described above, in this embodiment, by applying the scanning signal to at least adjacent scanning lines in the display panel having the plurality of display pixels two-dimensionally arranged therein from the scanning driver in an overlapping manner in a predetermined period, the display pixels in each row are sequentially set in the selected state, and the display data corresponding to the display pixels in each row is sequentially fetched and held in each latch section by the signal driver. At the same time, the gradation current of each row is sequentially supplied to each display pixel. Therefore, the gradation current based on the display data can be simultaneously written in the display pixels in the plurality of rows with the simple structure including the latch sections corresponding to several data lines constituting the data line groups in respective rows, thereby setting the gradation current write time to be substantially long.

Specifically, as shown in FIG. 9, in the configuration where the data line group arranged in each column comprises two data lines and two latch sections are provided in the current holding/distributing section in accordance with each data line group, it is possible to set a period which is ½ of the period of selecting the display pixels in a specific row by the scanning period to overlap the period of selecting the display pixels in the next row. That is, it is possible to set the selection period to overlap in adjacent rows only in a period corresponding to the number of data lines constituting the data line group.

Further, like the first embodiment, the number of the display pixels connected to each of the plurality of data lines constituting the data line group in each column can be greatly reduced to (½ in this embodiment) as compared with a known display apparatus in which one data line is arranged in one row. Therefore, a capacitance component consisting of a holding capacitance provided in the display element or a parasitic capacitance of the drive transistor can be reduced, and hence the time required to write the gradation current supplied to the data line in the display element can be decreased or a delay of this write time can be suppressed.

It is to be noted that this embodiment is configured in such a manner that the display data corresponding to the display pixels in each row is fetched and held in each latch section by the signal driver and, at the same time, the gradation current for each row is generated and sequentially supplied to each display pixel, and hence the latch operation in the current holding/distributing circuit (the latch section) must be rapidly executed. If the timing of the latch operation deviates due to a delay in signal or the like, there is a possibility that the display operation is obstructed.

Thus, in this embodiment, the latch operation of the display data (the signal current) in the current holding/distributing circuit (the latch section) is rapidly performed with a small current, and the current mirror circuit configuration is applied to an output stage for each data line. As a result, a current value (an absolute value) of the gradation current can be simply controlled to obtain a large current, and a delay in the latch operation can be suppressed.

As described above, in FIG. 9, each of the plurality of transistors constituting each current holding/distributing circuit 143A in the current holding/distributing section 140B comprises an n-channel type field effect thin film transistor in which an amorphous silicon semiconductor layer is a channel layer or a field effect thin film transistor in which a polysilicon semiconductor layer is a channel layer, and this current holding/distributing section 140B is integrally formed with the pixel array on the insulating substrate BASE on which the plurality of display pixels EM constituting the display panel 110B are formed. However, the present invention is not restricted to this configuration.

For example, the present invention may have a conformation in which the signal driver including the current generating section and the current holding/distributing section is an independent driver chip and this driver chip is mounted (packaged) on the substrate of the display panel.

A structural example in this case will now be briefly explained.

Figure 13:
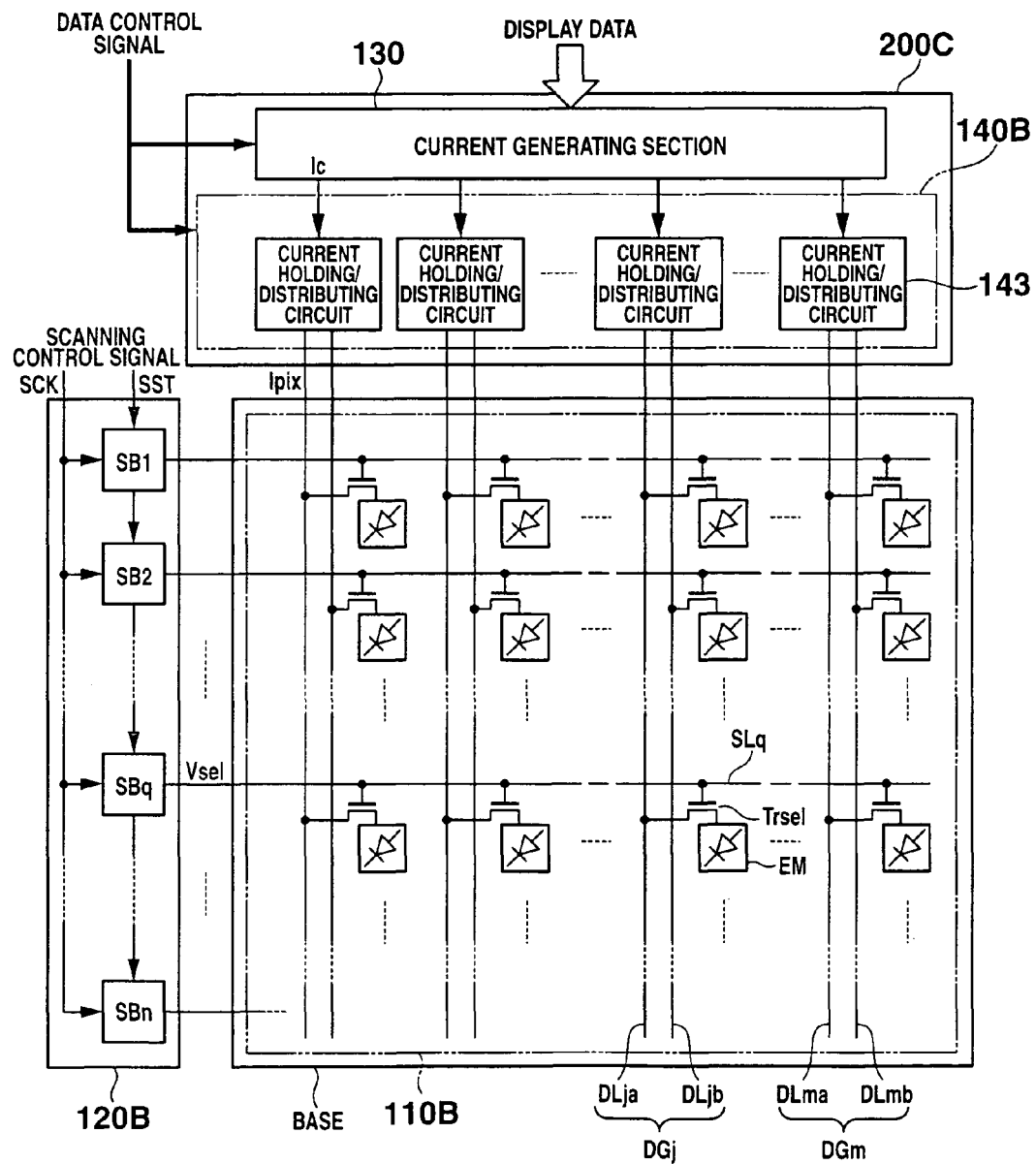
FIG. 13 is a schematic structural view showing a primary part of another structural example in the second embodiment of the display apparatus according to the present invention.

FIG. 13 is a schematic structural view showing a primary part of another structural example in the second embodiment of the display apparatus according to the present invention.

Here, structures equal to those in the foregoing structural example are denoted by like or equal reference numerals, thereby simplifying the explanation.

In FIG. 13, the signal driver 200C including the current holding/distributing section 140B and the current generating section 130 is configured as an independent driver chip. Here, the current holding/distributing circuit 143 in FIG. 13 comprises a plurality of field effect transistors or the like formed on a single-crystal silicon substrate, for example. The driver chip constituting this signal driver 200C is configured to be mounted (packaged) on the substrate BASE constituting the display panel 110B.

<Concrete Circuit Example of Display Pixel>

A concrete circuit example of the display pixel which can be applied to the display apparatus according to the present invention will now be described with reference to the accompanying drawings.

Figure 14:
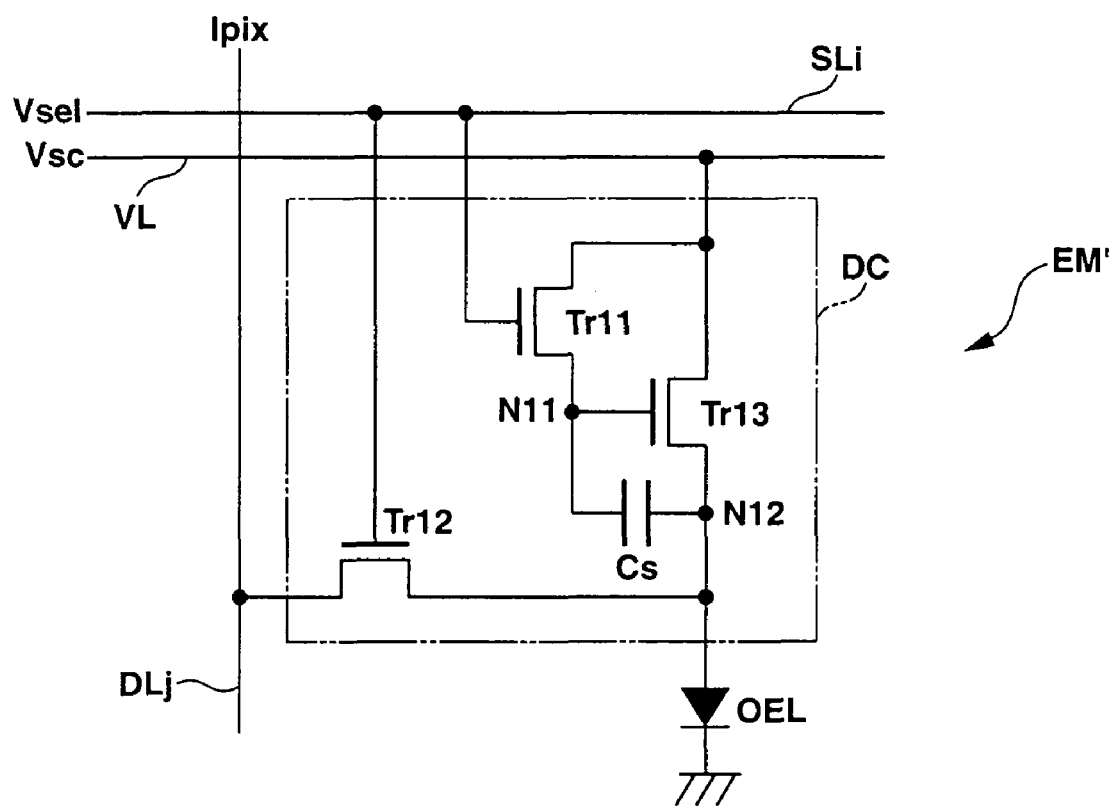
FIG. 14 is a circuit block diagram showing a concrete circuit example of a display pixel which can be applied to the display apparatus according to the present invention.

FIG. 14 is a circuit block diagram showing a concrete circuit example of the display pixel which can be applied to the display apparatus according to the present invention.

Figure 15A:
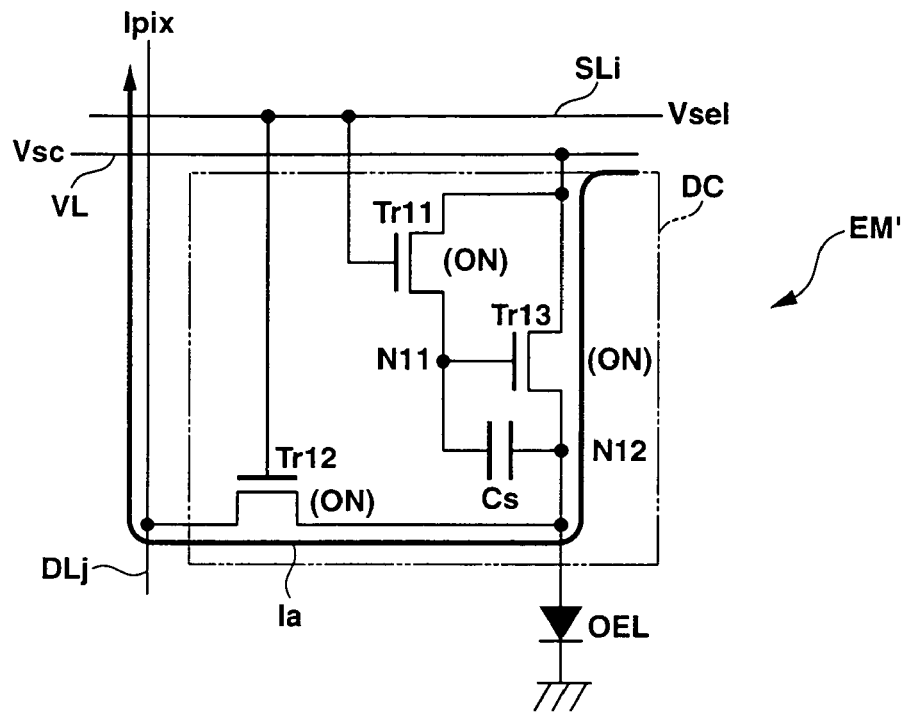
FIGS. 15A and 15B are conceptual views showing a drive control operation of a pixel drive circuit according to the embodiment depicted in FIG. 9.
Figure 15B:
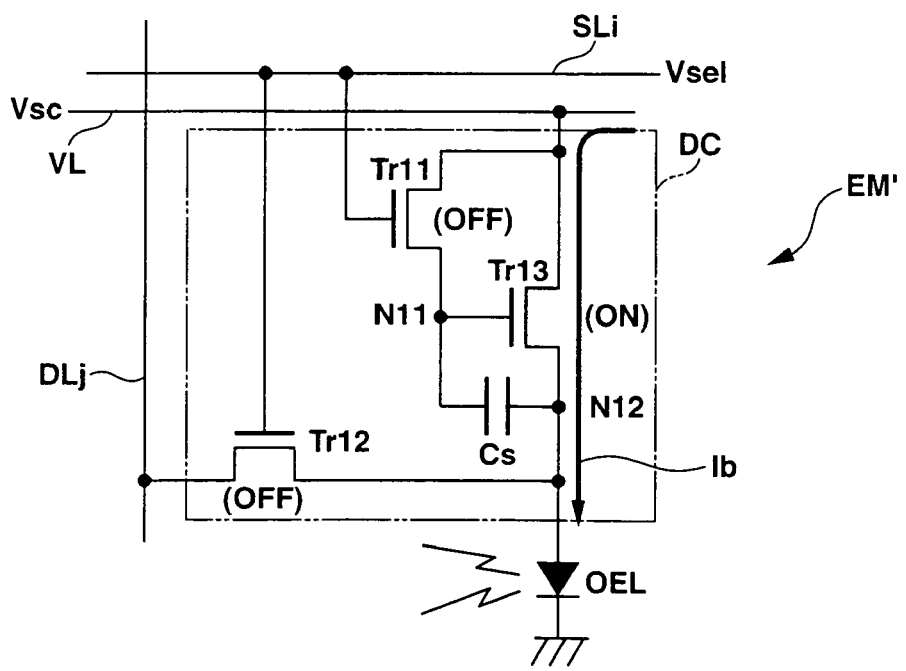

FIGS. 15A and 15B are conceptual views showing drive control operations of the pixel drive circuit according to this embodiment.

Figure 16:
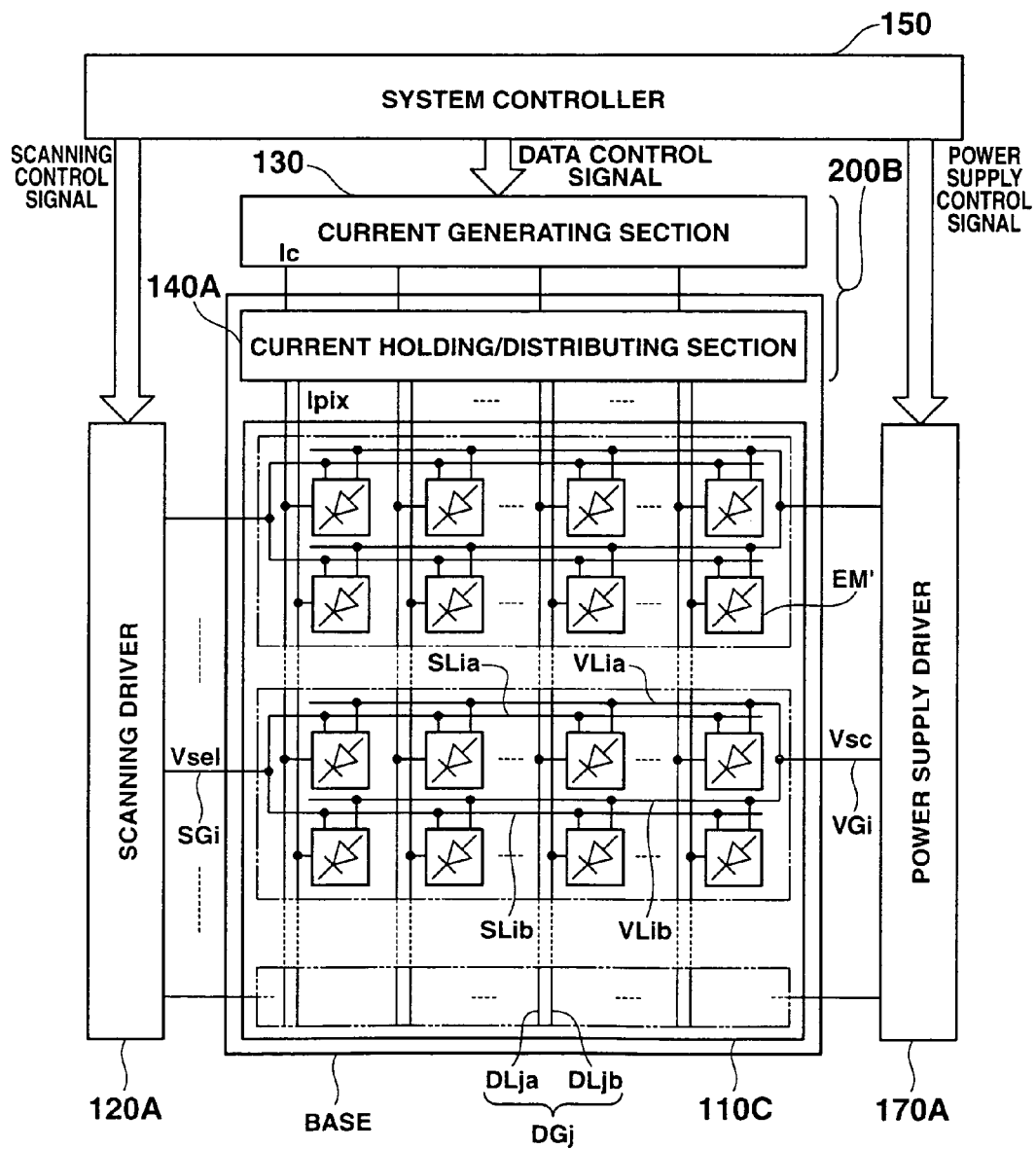
FIG. 16 is a schematic block diagram showing a structural example of the display apparatus to which a display pixel according to the embodiment depicted in FIG. 14 is applied.

FIG. 16 is a schematic block diagram showing a structural example of the display apparatus to which the display pixel according to this embodiment is applied.

Figure 17:
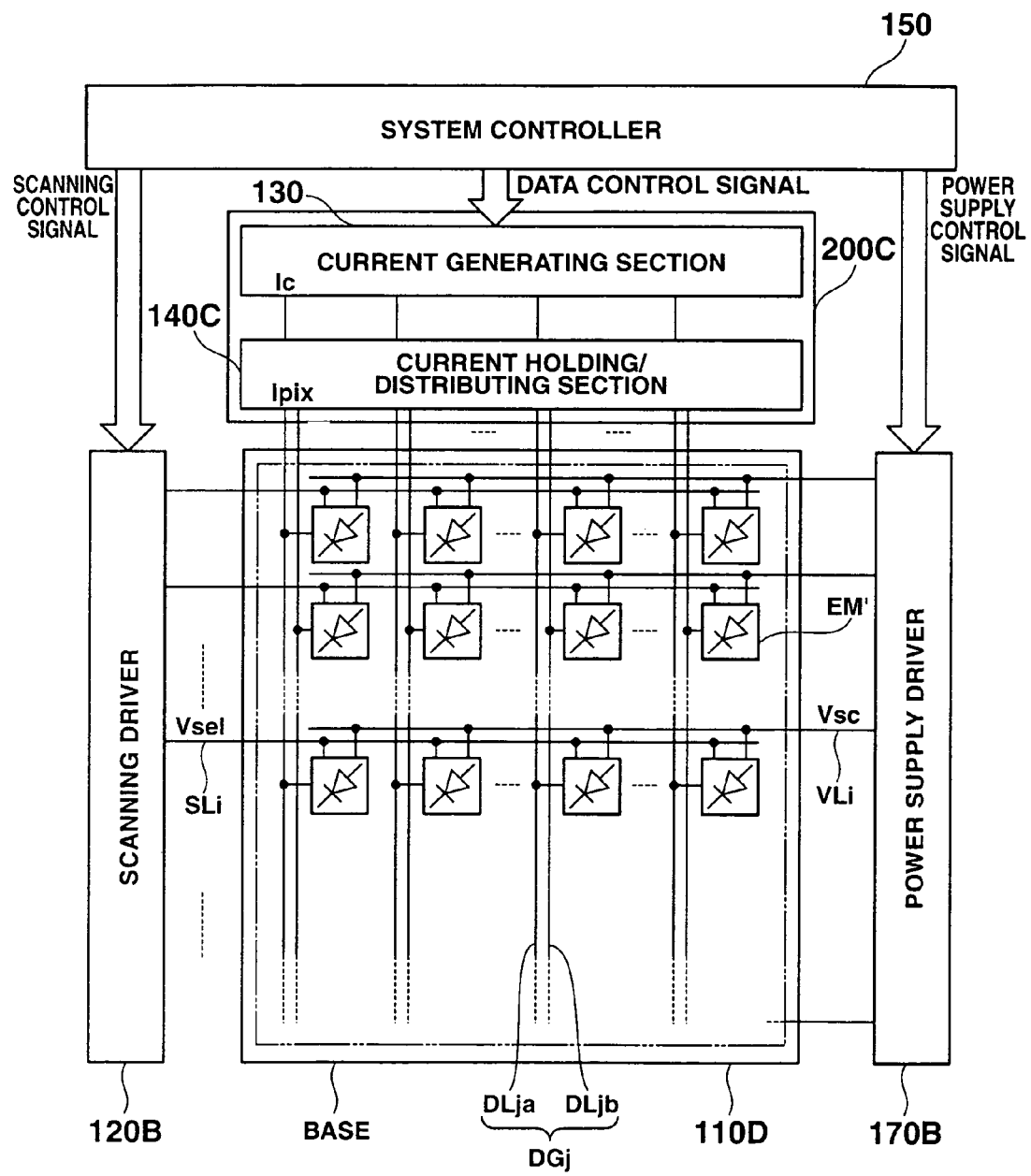
FIG. 17 is a schematic block diagram showing still another structural example of the display apparatus to which the display pixel according to the embodiment depicted in FIG. 14 is applied.
Figure 18:
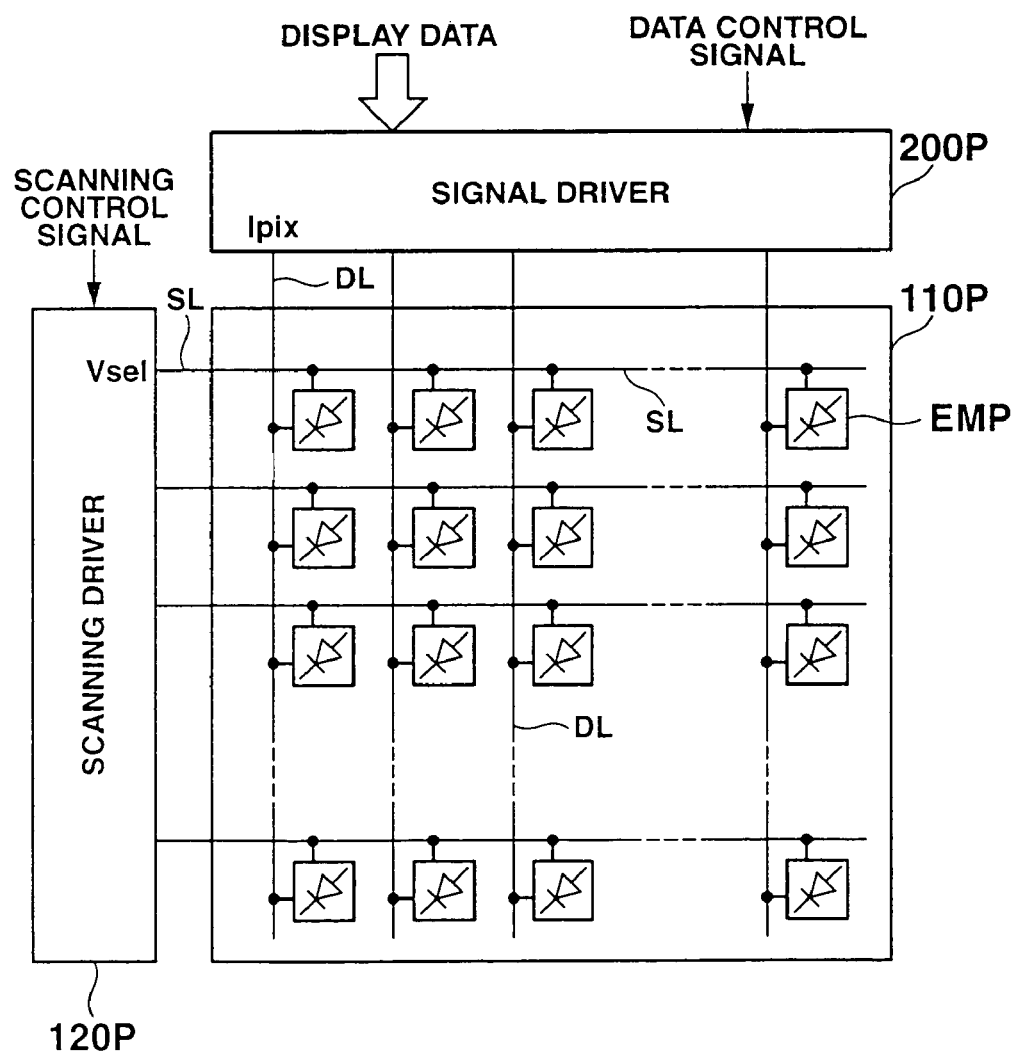
FIG. 18 is a schematic view showing a structural example of a primary part of a light emitting element type display adopting an active matrix drive mode in a prior art.
Figure 19:
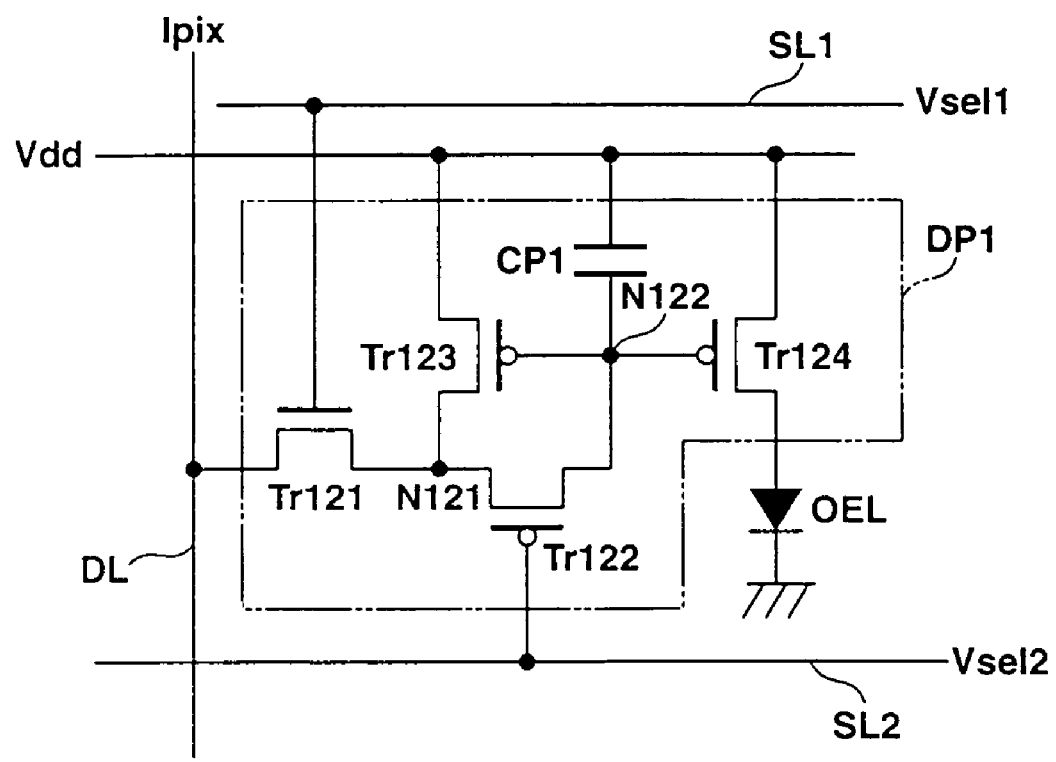
FIG. 19 is an equivalent circuit diagram showing a structural example of a display pixel applied to the light emitting element type display adopting the active matrix drive mode in the prior art.

FIG. 17 is a schematic block diagram showing another structural example of the display apparatus to which the display pixel according to this embodiment is applied.

As shown in FIG. 14, a display pixel EM' (a structure comprising the display pixel EM and the selection transistor Trsel described in connection with the first embodiment) is generally configured to have: a pixel drive circuit DC which sets the display pixel EM' in a selected state based on a scanning signal Vsel applied from the scanning driver 120A or 120B, fetches a gradation current Ipix supplied from the current holding/distributing section 140A or 140B in the selected state, and passes a drive current corresponding to the gradation current Ipix to a light emitting element; and a current controlled type light emitting element comprising an EL element or an OEL element which emits a light with a predetermined luminance gradation based on the drive current supplied from the pixel drive circuit DC.

For example, as shown in FIG. 14, the pixel drive circuit DC comprises: an n-channel type transistor Tr11 in which a control terminal (a gate terminal) is connected to a scanning line SLi (corresponding to the scanning line SLia, and SLib or SLq constituting the scanning line group SGi described in conjunction with each of the foregoing embodiments) and a current path (a source—a drain) is connected to a power supply line VL and a contact point N11; an n-channel type transistor Tr12 in which a control terminal is connected with the scanning line SLi and a current path is connected with a data line DLj (each data line DLja or DLjb constituting the data line group DGj described in conjunction with each of the foregoing embodiments) and a contact point N12; an n-channel type transistor Tr13 in which a control terminal is connected with the contact point N11 and a current path is connected with the power supply line VL and the contact point N12; and a capacitor (a holding capacitance) Cs connected between the contact point N11 and the contact point N12. An anode terminal of an organic EL element OEL is connected to the contact point N12, and a cathode terminal of the same is connected to a ground terminal. Here, the capacitor Cs may be a parasitic capacitance formed between the gate and the source of the transistor Tr13. Moreover, the transistor Tr12 corresponds to the selection transistor Trsel described in conjunction with each of the foregoing embodiments.

The light emission drive control of the light emitting element (the organic EL element OEL) in the pixel drive circuit DC having such a configuration is executed by, e.g., simultaneously setting the display pixels EM' in a plurality of rows in a selected state within one scanning period Tsc as one cycle so that the selected states of the display pixels overlap in a predetermined period, and setting a selection period (a write operation period) Tse in which a drive current Ipix corresponding to display data is written and held as a voltage component and a non-selection period (a light emitting operation period) Tnse in which a drive current corresponding to the display data is supplied to the organic EL element based on the voltage component written and held in the selection period Tse to emit a light with a predetermined luminance gradation (Tse=Tse+Tnse).

(Selection Period)

That is, in the selection period Tse for the display pixels EM', the display pixels EM' in a plurality of rows are first simultaneously (or overlappingly in a predetermined period) to a selected state by applying a scanning signal Vsel at the high level to specific scanning lines SLi from the scanning driver and, at the same time, a power supply voltage Vsc at the low level is applied to the power supply line VL of the display pixels in the plurality of rows. Further, in synchronization with this timing, a gradation current Ipix having a negative polarity corresponding to display data of the display pixels EM' in the plurality of rows is supplied to each data line DLj from the current holding/distributing section.

As a result, as shown in FIG. 15A, the transistors Tr11 and Tr12 constituting the pixel drive circuit DC are turned on, and the power supply voltage Vsc at the low level is applied to the contact point N11 (that is, the gate terminal of the transistor Tr13 and one end of the capacitor Cs). Furthermore, the operation of drawing the gradation current Ipix toward the current holding/distributing section through the data line DL is performed. As a result, a voltage level whose potential is lower than the power supply voltage Vsc at the low level is applied to the contact point N12 (that is, the source terminal of the transistor Tr13 and the other end of the capacitor Cs).

In this manner, a potential difference is generated between the contact points N11 and N12 (between the gate and the source of the transistor Tr13). As a result, the transistor Tr13 is turned on, and a write current Ia corresponding to the gradation current Ipix flows toward the current holding/distributing section from the power supply line VL through the transistor Tr13, the contact point N12, the transistor Tr12 and the data line DL.

At this time, the electric charges corresponding to the potential difference generated between the contact points N11 and N12 (between the gate and the source of the transistor Tr13) is stored in the capacitor Cs, and held (charged) as a voltage component. Moreover, the power supply voltage Vsc having a voltage level which is not greater than the ground potential is applied to the power supply line VL, and the write current Ia is controlled to flow in the direction of the data line DL. Therefore, a potential applied to an anode terminal (the contact point N12) of the organic EL element becomes lower than a potential (the ground potential) of the cathode terminal, and a reverse bias voltage is applied to the organic EL element OEL. Therefore, the drive current does not flow through the organic EL element OEL, and the light emitting operation is not carried out.

(Non-Selection Period)

Subsequently, in the non-selection period Tnsec after completion of the selection period Tse, the scanning signal Vsel at the low level is applied to specific scanning lines SLi from the scanning driver so that the display pixels in a plurality of rows are set in a non-selected state, and the power supply voltage Vsc at the high level is applied to the power supply line VL of the display pixels in the plurality of rows. Further, in synchronization with this timing, the operation of drawing the gradation current Ipix by the current holding/distributing section is stopped.

As a result, as shown in FIG. 15B, the transistors Tr11 and Tr12 constituting the pixel drive circuit DC are turned off, and application of the power supply voltage Vsc to the contact point N11 (i.e., the gate terminal of the transistor Tr13 and one end of the capacitor Cs) is interrupted. Furthermore, application of the voltage level to the contact point N12 (i.e., the source terminal of the transistor Tr13 and the other end of the capacitor Cs) due to the operation of drawing the gradation current Ipix by the current holding/distributing section is interrupted. Therefore, the capacitor Cs holds the electric charges stored in the selection period.

When the capacitor Cs holds the charges voltage in the write operation in this manner, the potential difference between the contact points N11 and N12 (between the gate and the source of the transistor Tr13) is held, and hence the transistor Tr13 maintains the ON state. Moreover, since the power supply voltage Vsc having a voltage level higher than the ground potential is applied to the power supply line VL, the potential applied to the anode terminal (the contact point N12) of the organic EL element OEL becomes higher the potential (the ground potential) of the cathode terminal.

Therefore, a predetermined drive current Ib flows from the power supply line VL to the organic EL element OEL in a forward bias direction through the transistor Tr13 and the contact point N12, and the organic EL element OEL emits a light. Here, since the potential difference (the charges voltage) held by the capacitor Cs corresponds to a potential difference in case of passing a write current Ia corresponding to the gradation current Ipix in the transistor Tr13, the drive current Ib passed to the organic EL element OEL has the same current value as that of the write current Ia.

As a result, in the non-selection period Tnse after the selection period Tse, the drive current is continuously supplied through the transistor Tr13 based on the voltage component corresponding to the display data (the gradation current Ipix) written in the selection period Tse, and the organic EL element OEL continues the operation of emitting a light with the luminance gradation corresponding to the display data.

Then, the series of the operations mentioned above is sequentially repeatedly executed with respect to all the scanning lines SLi constituting the display panel 110A or 110B based on the drive control operation of the display apparatus mentioned above. As a result, the display data for one screen of the display panel is written, a light is emitted with a predetermined luminance gradation, and desired image information is displayed.

Here, in the image drive circuit DC according to this embodiment, since the transistors Tr11 to Tr13 can be constituted by using transistors having the same channel polarity (the n-channel type), it is possible to apply an n-channel type field effect thin film transistor in which an amorphous silicon layer is a channel layer or a field effect thin film transistor in which a polysilicon layer is a channel layer like the circuit configuration of the current holding/distributing sections (the current distribution circuit, the current holding circuit, and the current holding/distributing circuit) 140A and 140B. In this case, the current holding/distributing sections 140A and 140B and the display panels 110A and 110B can be integrally formed on the single insulating substrate. In particular, when the display panel and the current holding/distributing section are constituted by applying the n-channel type field effect thin film transistor using an amorphous silicon semiconductor layer, the field effect thin film transistor having stable operation characteristics can be relatively inexpensively manufactured by applying the established amorphous silicon manufacturing technique. Therefore, even if the high definition of the display panel is realized or the display panel is increased in size, the display apparatus having the good display image quality can be readily and excellently realized.

Here, as a configuration which applies a predetermined power supply voltage Vcs to the power supply line VL in the pixel drive circuit DC according to this embodiment, with respect to the configuration depicted in FIG. 2, as shown in, e.g., FIG. 16, it is possible to excellently apply a configuration in which a power supply drive 170A connected to each power supply line group VGi is provided in a peripheral area of the display panel 110C in which each power supply line group VGi comprising power supply lines VLia and VLib is arranged in parallel with the respective scanning lines SLia and SLib of each scanning line group SGi and, the power supply voltage Vcs having a predetermined voltage value is applied to each power supply line group VGi from the power supply driver 170A based on a power supply control signal fed from the system controller 150 in synchronization with a timing of outputting the scanning signal Vsel from the scanning driver 120A.

Further, with respect to the configuration depicted in FIG. 13, as shown in, e.g., FIG. 17, it is possible to excellently apply a configuration in which a power supply driver 170B connected with each power supply line VLi is provided in a peripheral area of the display panel 110D in which each power supply line VLi is arranged in parallel with each scanning line SLi in each row, and the power supply voltage Vcs having a predetermined voltage value is applied to each power supply line VLi from the power supply driver 170B based on a power supply control signal fed from the system controller 150 in synchronization with a timing of outputting the scanning signal Vsel from the scanning driver 120B.

It is to be noted that the description has been given as to the circuit configuration corresponding to the current application scheme which comprises three transistors as the pixel drive circuit DC and draws the gradation current Ipix in a direction of the current holding/distributing section (i.e., a direction of the signal driver) through the data line DLj in the display pixel EM', but the present invention is not restricted to this embodiment. It is possible to use the display apparatus comprising the pixel drive circuit to which at least the current application mode is applied and having another circuit configuration as long as the display apparatus has a light emission control transistor which controls supply of a drive current to the light emitting element and a write control transistor which controls a gradation current write operation, and holds the gradation current (the write current) corresponding to the display data and then turns on the light emission control transistor based on the gradation current to supply the gradation current, thereby allowing the light emitting element to emit a light with a predetermined luminance gradation. For example, the present invention may have a circuit configuration comprising, e.g., four transistors, or may have a circuit configuration which passes the gradation current in a direction of the display pixel (the pixel drive circuit) from the current holding/distributing section side (i.e., the signal driver side) through the data line.

Furthermore, although the description has been given as to the configuration in which the organic EL element is applied as the light emitting element constituting the display pixel in the foregoing embodiments, the display apparatus according to the present invention is not restricted thereto. It is possible to excellently apply, e.g., a light emitting diode or any other light emitting element as well as the above-described organic EL element as long as it is a current controlled type light emitting element which emits a light with a predetermined luminance gradation in accordance with a current value of the drive current supplied thereto.

What is claimed is:

1. A display drive apparatus which drives a plurality of two-dimensionally arranged display pixels comprising a display panel based on display data, the display drive apparatus comprising:
   a selection circuit which sequentially sets the display pixels in each of a plurality of rows of the display panel in a selected state at every predetermined selection period including a first former period and a second later period, wherein the second later period of the selection period in one of the two adjacent rows of said plurality of the rows and the first former period in the other of the two adjacent rows are set as overlap periods which overlap with each other, and wherein the first former period of the selection period in one of the two adjacent rows of said plurality of the rows and the second later period in the other of the two adjacent rows are set as non-overlap periods which do not overlap with each other;
   a gradation signal generation circuit which generates a signal current as a gradation signal which controls a luminance gradation of each display pixel based on the display data, and which outputs the gradation signal corresponding to the pixels in each of a plurality of columns of the display panel in time-series at a timing corresponding to the first former period of the selected period in each row; and
   a current write circuit including a plurality of current holding/distributing circuits respectively provided to the columns of the display panel, each of which includes two latch sections for supplying a gradation current corresponding to the gradation signal in the selection period in each row,
   wherein each of the latch sections (i) in the first former period of the selection period in each row, supplies the gradation current to the corresponding display pixel, based on the gradation signal corresponding to one of two display pixels in one row of the display pixels in said two adjacent rows, of the gradation signals output by the gradation signal generation circuit, while fetching and holding said gradation signal corresponding to another one of two display pixels, and (ii) in the second later period of the selection period, supplies the gradation current to the corresponding display pixel in another row of said two adjacent rows, based on the gradation signal held in the first former period.

2. The display drive apparatus according to claim 1, wherein at least the current write circuit has a conformation which is independent from the display panel.

3. The display drive apparatus according to claim 1, wherein at least the current write circuit is integrally formed to the display panel.

4. The display drive apparatus according to claim 1, wherein the current write circuit has means for generating and outputting the gradation current whose a current polarity is reversed from that of the gradation signal supplied from the gradation signal generation circuit.

5. The display drive apparatus according to claim 1, wherein the selection circuit has means for simultaneously setting the display pixels in the plurality of specific rows of the display panel in the selected state based on a single selection signal, and the current write circuit has means for simultaneously supplying the gradation current to the display pixels in the plurality of specific rows in accordance with the timing of setting the display pixels in the selected state by the selection signal.

6. The display drive apparatus according to claim 5, wherein the gradation signal generation circuit has means for sequentially supplying the gradation signal corresponding to the plurality of display pixels in each column of the display pixels in the plurality of specific rows to the current write circuit in time series, and the current write circuit has:
   a plurality of signal distribution circuits which sequentially distribute the gradation signal supplied by the gradation signal generation circuit in accordance with the plurality of display pixels in each column at the timing of the time-series supply; and
   a plurality of current holding circuits which individually hold the gradation signal distributed by the signal distributing section, and simultaneously supply a current having a current value based on the held gradation signal to the display pixels in the plurality of specific rows as the gradation current,
   the signal distribution circuits and the current holding circuits being provided in accordance with each column of the display pixels in the plurality of specific rows.

7. The display drive apparatus according to claim 6, wherein each current holding circuit has signal holding/outputting sections on a plurality of stages, the signal holding/outputting section comprising:
   a signal holding section which holds a signal current distributed by the signal distribution circuit in accordance with each of the plurality of display pixels in each column of the display pixels in the plurality of specific rows; and
   a gradation current outputting section which outputs a current corresponding to the signal current held in the signal holding section as the gradation current,
   wherein an operation of fetching and holding the signal current by the signal holding section on one stage in the signal holding/outputting sections on the plurality of stages, and an operation of outputting the gradation current from the gradation current outputting section on any other stage are controlled to be simultaneously executed.

8. The display drive apparatus according to claim 7, wherein the signal holding section comprises a charges storage circuit which stores electric charges based on the signal current and holds the electric charges as a voltage component.

9. The display drive apparatus according to claim 7, wherein the gradation current outputting section has a current mirror circuit configuration which generates and outputs as the gradation current a current having a current value with a predetermined current ratio with respect to a current value corresponding to the gradation signal supplied from the gradation signal generation circuit.

10. The display drive apparatus according to claim 1, wherein the selection circuit comprises means for sequentially applying a selection signal which sets the display pixels in each row in the selected state to each of said two adjacent rows of the display panel with the first former and second later periods, thereby sequentially setting the display pixels corresponding to each of said two adjacent rows in the selected state with the first former and second later periods.

11. The display drive apparatus according to claim 10, wherein each of the latch sections comprises means for sequentially supplying the gradation current to two display pixels in each of said two adjacent rows with periods overlapped with each other corresponding to the second later period of the selection period in one of said two adjacent rows, at a timing of applying the selection signal by the selection circuit.

12. The display drive apparatus according to claim 1, wherein each of the latch sections includes:
a signal distributing section which distributes the gradation signal output by the gradation signal generation circuit in accordance with the timing of time-series supply to each of the latch sections;
a current holding section which holds the gradation signal distributed by the signal distributing section; and
a gradation current outputting section which outputs, as the gradation current, a current corresponding to the gradation signal held in the signal holding section;
wherein the display panel includes a first data line connected to one of said two display pixels in each of said two adjacent rows, and a second data line connected to the other of said two display pixels, and
wherein each of said two latch sections controls to allow first and second operations to be executed in parallel, wherein (i) by the first operation, the gradation current outputting section outputs the gradation current based on the gradation signal held by the signal holding section to one of the first and second data lines, in the first former period of the selection period, in one of said two latch sections, and (ii) by the second operation, the gradation current outputting section outputs the gradation current based on the gradation signal held by the signal holding section in the first former period to the other of the first and second data lines, in the second later period of the selection period, in the other of said two latch sections.

13. The display drive apparatus according to claim 12, wherein the signal holding section includes a charges storage circuit which stores electric charges based on the gradation signal and holds the electric charges as a voltage component.

14. The display drive apparatus according to claim 12, wherein the gradation current outputting section has a current mirror circuit configuration which generates and outputs as the gradation current a current having a current value with a predetermined current ratio with respect to a current value corresponding to the gradation signal supplied from the gradation signal generation circuit.

15. A display apparatus which displays image information based on display data, the display apparatus comprising:
a display panel which has a plurality of scanning lines arranged in a row direction, a plurality of data lines arranged in a column direction, and a plurality of display pixels arranged in a matrix form in the vicinity of intersections of the plurality of scanning lines and the plurality of data lines, said plurality of data lines including a first data line connected to one of two display pixels in each row of two adjacent rows of a plurality of rows, and a second data line connected to the other of said two display pixels;
a scanning driver which sequentially sets the display pixels in each of said plurality of rows corresponding to said plurality of scanning lines in a selected state in every predetermined selection period including a first former period and a second later period, wherein the second later period of the selection period in one of the two adjacent rows of said plurality of the rows and the first former period in the other of the two adjacent rows are set to overlap periods which overlap with each other, and wherein the first former period of the selection period in one of the two adjacent rows of said plurality of the rows and the second later period in the other of the two adjacent rows are set to non-overlap periods which do not overlap with each other; and
a signal driver comprising:
(i) a gradation signal generation circuit to which the display data is supplied which generates a signal current as a gradation signal which controls a luminance gradation of each display pixel based on the display data, and which outputs the gradient signal corresponding to the pixels in each of a plurality of columns of the display panel in time-series at a timing corresponding to the first former period of the selection period in each row, and
(ii) a current write circuit including a plurality of current holding/distribution circuits respectively provided to columns of the display panel, each of which includes two latch sections for supplying a gradation current corresponding to the gradation signal in the selection period in each row,
wherein each of the latch sections (i) in the first former period of the selection period in each row, supplies the gradation current to the corresponding display pixel, based on the gradation signal corresponding to one of two display pixels in one row of the display pixels in said two adjacent rows, of the gradation signals output by the gradation signal generation circuit, while fetching and holding said gradation signal corresponding to another one of two display pixels, and (ii) in the second later period of the selection period, supplies the gradation current to the corresponding display pixel in another row of said two adjacent rows, based on the gradation signal held in the first former period.

16. The display apparatus according to claim 15, wherein at least the signal driver has a conformation which is independent from the display panel.

17. The display apparatus according to claim 15, wherein the display panel and at least the current write circuit in the signal driver are formed on a single insulating substrate.

18. The display apparatus according to claim 15, wherein the current write circuit in the signal driver has means for generating and outputting the gradation current whose current polarity is reversed from that of the gradation signal supplied from the gradation signal generation circuit.

19. The display apparatus according to claim 15, wherein the display pixel comprises:
a pixel drive circuit which generates a predetermined drive current based on the gradation current output from the signal driver; and
a current controlled type light emitting element which emits a light with a predetermined luminance gradation based on a current value of the drive current.

20. The display apparatus according to claim 19, wherein the light emitting element is an organic electroluminescent element.

21. The display apparatus according to claim 15, wherein the display panel has a plurality of data line groups each of which has a plurality of data lines corresponding to the number of scanning lines in each scanning line group among the plurality of data lines being determined as one set.

22. The display apparatus according to claim 21, wherein each data line group is arranged in each area between the columns of the plurality of display pixels arranged in the matrix form in the display panel.

23. The display apparatus according to claim 21, wherein the display panel has a plurality of scanning line groups each of which has the plurality of specific scanning lines determined as one set, the scanning driver has means for applying a single scanning signal which sets the display pixels in a selected state to each scanning line group to simultaneously set the display pixels corresponding to the plurality of specific scanning lines in the selected state, the gradation signal generation circuit in the signal driver has means for sequentially supplying the gradation signal corresponding to the plurality of display pixels corresponding to each scanning group in each data line of each data line group to the current write circuit in time series, and the current write circuit in the signal driver comprises:
 a plurality of signal distribution circuits which sequentially distribute the gradation signal supplied from the gradation signal generation circuit in accordance with each data line of each data line group at the timing of time-series supply; and
 a plurality of current holding circuits which individually hold the gradation signal distributed by the signal distributing section and simultaneously supply as the gradation current a current having a current value based on the held gradation signal to each data line of each data line group in accordance with a timing of applying the scanning signal to each scanning line group,
 the signal distribution circuits and the current holding circuits being provided in accordance with the respective data line groups.

24. The display apparatus according to claim 23, wherein each of the current holding circuits has signal holding/outputting sections on a plurality of stages, each of the signal holding/outputting section including:
 a signal holding section which holds the gradation signal distributed by the signal distribution circuit in accordance with each data line of each data line group; and
 a gradation current outputting section which outputs as the gradation current a current having a current value based on the gradation signal held in the signal holding section,
 wherein an operation of fetching and holding the gradation signal by the signal holding section on one stage of the signal holding/outputting sections on the plurality of stages, and an operation of outputting the gradation current from the gradation current outputting section on any other stage are controlled to be simultaneously executed.

25. The display apparatus according to claim 24, wherein the signal holding section includes a charges storage circuit which stores electric charges corresponding to the gradation signal and holds the electric charges as a voltage component.

26. The display apparatus according to claim 24, wherein the gradation current outputting section has a current mirror circuit configuration which generates and outputs as the gradation current a current having a current value with a predetermined current ratio with respect to a current value corresponding to the gradation signal supplied from the gradation signal generation circuit.

27. The display apparatus according to claim 21, wherein the scanning driver has means for sequentially applying a scanning signal which sets the display pixels in a selected state to each of the plurality of specific scanning lines with the overlapping periods to sequentially set the display pixels corresponding to the plurality of specific scanning lines in the selected state with the overlapping periods, and the current write circuit in the signal driver has means for sequentially supplying the gradation current to each data line of each data line group with the overlapping periods at the timing of applying the scanning signal by the scanning driver.

28. The display apparatus according to claim 21, wherein the scanning driver has means for sequentially applying a scanning signal which sets the display pixels in a selected state to each of the plurality of specific scanning lines with the overlapping periods to sequentially set the display pixels corresponding to the plurality of specific scanning lines in the selected state with the overlapping periods,
 the gradation signal generation circuit in the signal driver has means for sequentially supplying the gradation signal corresponding to the plurality of display pixels corresponding to the plurality of specific scanning lines in each data line of each data line group to the current write circuit in time series, and
 the current write circuit has a plurality of current holding circuits each of which is provided in accordance with each data line group, sequentially holds the gradation signal supplied from the gradation signal generation circuit in accordance with the timing of time-series supply, and sequentially supplies as the gradation current a current having a current value corresponding to the gradation signal to each data line of each data line group at the timing corresponding to application of the scanning signal.

29. The display apparatus according to claim 28, wherein each current holding circuit includes a plurality of current holding/outputting sections in accordance with each data line of each data line group, the current holding/outputting section having:
 a signal distributing section which sequentially distributes the gradation signal in accordance with each data line of each data line group at the timing of the time-series supply;
 a signal holding section which holds the gradation signal distributed by the signal distributing section; and
 a gradation current outputting section which outputs as the gradation current a current having a current value based on the gradation signal held in the signal holding section,
 wherein an operation of holding the gradation signal distributed by the signal distributing section in the signal holding section in one of the current holding/outputting sections and outputting the gradation current based on the gradation signal by the gradation current outputting section, and an operation of outputting the gradation current based on the gradation signal held in the signal holding section by the gradation current outputting section in any other current holding/outputting section are controlled to be simultaneously executed in the overlapping periods.

30. The display apparatus according to claim 29, wherein the signal holding section includes a charges storage circuit which stores electric charges corresponding to the gradation signal and holds the electric charges as a voltage component.

31. The display apparatus according to claim 29, wherein the gradation current outputting section has a current mirror circuit configuration which generates and outputs as the gradation current a current having a current value with a predetermined current ratio with respect to a current value corresponding to the gradation signal supplied from the current generating section.

32. A drive method of a display apparatus which displays image information based on display data, the display apparatus having a plurality of scanning lines arranged in a row direction, a plurality of data lines arranged in a column direction, and a display panel having a plurality of display pixels which are arranged in the vicinity of intersections of the plurality of scanning lines and the plurality of data lines and arranged in a matrix form, said plurality of data lines including a first data line connected to one of two display pixels in each row of two adjacent rows of a plurality of rows, and a second data line connected to the other of said two display pixels, the drive method comprising:

sequentially setting the display pixels in each of said plurality of rows corresponding to said plurality of scanning lines in a selected state in every predetermined selection period including a first former period and a second later period, wherein the second later period of the selection period in one of the two adjacent rows of said plurality of the rows and the first former period in the other of the two adjacent rows are set to overlap periods overlapped with each other, and wherein the first former period of the selection period in one of the two adjacent rows of said plurality of the rows and the second later period in the other of the two adjacent rows are set to non-overlap periods which do not overlap with each other;

generating, by a gradation signal generation circuit to which the display data is supplied, a signal current as a gradation signal which controls a luminance gradation of each display pixel based on the display data, and outputting the gradation signal corresponding to the pixels in each of a plurality of columns of the display panel in time-series at a timing corresponding to the first former period of the selection period in each row; and supplying, by each of two latch sections of each of a plurality of current holding/distributing circuits of a current write circuit, a gradation current corresponding to the gradation signal in the selection period in each row, wherein each of the latch sections (i) in the first former period of the selection period in each row, supplies the gradation current to the corresponding display pixel, based on the gradation signal corresponding to one of two display pixels in one row of the display pixels in said two adjacent rows, of the gradation signals output by the gradation signal generation circuit, while fetching and holding said gradation signal corresponding to another one of two display pixels, and (ii) in the second later period of the selection period, supplies the gradation current to the corresponding display pixel in another row of said two adjacent rows, based on the gradation signal held in the first former period.

33. The drive method of a display apparatus according to claim 32, wherein the operation of generating and outputting the gradation current having a current value based on the gradation signal includes:

an operation of generating a current having a current value with a predetermined current ratio with respect to a current value corresponding to the gradation signal and outputting the generated current as the gradation current.

34. The drive method of a display apparatus according to claim 32, wherein the operation of setting the display pixels in the selected state includes an operation of simultaneously applying a single scanning signal which sets the display pixels in the selected state to the plurality of specific scanning lines to simultaneously set the display pixels corresponding to the plurality of scanning lines in the selected state, and the operation of supplying the gradation current includes an operation of simultaneously supplying the gradation current to the display pixels corresponding to the plurality of scanning lines in accordance with the timing of applying the scanning signal.

35. The drive method of a display apparatus according to claim 34, wherein the operation of simultaneously supplying the gradation current to the display pixels corresponding to the plurality of scanning lines includes an operation which simultaneously executes:

an operation of fetching and holding the gradation signal corresponding to each scanning line; and an operation of outputting the gradation current based on the gradation signal fetched and held at the foregoing timing.

36. The drive method of a display apparatus according to claim 32, wherein the operation of setting the display pixels in the selected state sequentially applies a scanning signal which sets the display pixels in the selected state to each of said two adjacent rows with the first former and second later periods to sequentially set the display pixels corresponding to each of said two adjacent rows in the selected state with the first former and second later periods, and the operation of supplying the gradation current includes an operation of sequentially supplying the gradation current to the display pixels corresponding to each of said adjacent two rows at the timing of applying the scanning signal with the overlapping periods.

37. The drive method of a display apparatus according to claim 36, wherein the operation of sequentially supplying the gradation current simultaneously executes first and second operations in parallel, wherein (i) in the first operation, the gradation current based on the gradation signal is outputted to one of the first and second data lines while the gradation signal is fetched and held, in the first former period of the selection period in one of said adjacent two rows, in one of said two latch sections, and (ii) in the second operation, the gradation current based on the gradation signal fetched and held in the first former period is outputted to the other of the first and second data lines, in the second later period of the selection period, in the other of said two latch section.

* * * * *